US010120134B2

(12) United States Patent
Saadany et al.

(10) Patent No.: US 10,120,134 B2
(45) Date of Patent: Nov. 6, 2018

(54) MICRO-OPTICAL BENCH DEVICE WITH HIGHLY/SELECTIVELY-CONTROLLED OPTICAL SURFACES

(71) Applicant: Si-Ware Systems, Cairo (EG)

(72) Inventors: Bassam Saadany, Cairo (EG); Yasser M. Sabry, Cairo (EG); Mostafa Medhat, Heliopolis (EG); Bassem Mortada, Cairo (EG); Muhammed Nagi, Cairo (EG); Mohamed Sadek, Cairo (EG); Yasseen Nada, Heliopolis (EG); Khaled Hassan, Cairo (EG)

(73) Assignee: SI-WARE SYSTEMS, Cairo (EG)

( * ) Notice: Subject to any disclaimer, the term of this patent is extended or adjusted under 35 U.S.C. 154(b) by 0 days.

(21) Appl. No.: 15/047,205

(22) Filed: Feb. 18, 2016

(65) Prior Publication Data

US 2016/0246002 A1    Aug. 25, 2016

Related U.S. Application Data

(60) Provisional application No. 62/119,073, filed on Feb. 20, 2015.

(51) Int. Cl.
| | |
|---|---|
| *G02B 6/12* | (2006.01) |
| *G02B 6/136* | (2006.01) |
| *G02B 6/36* | (2006.01) |
| *G01B 9/02* | (2006.01) |
| *B81C 1/00* | (2006.01) |

(Continued)

(52) U.S. Cl.
CPC .......... *G02B 6/136* (2013.01); *B81C 1/00833* (2013.01); *G01B 9/02051* (2013.01); *G01J 3/0259* (2013.01); *G01J 3/453* (2013.01); *G02B 6/3692* (2013.01); *B81B 2201/047* (2013.01)

(58) Field of Classification Search
CPC ...... H01L 2924/00; H01L 2924/00014; G02B 6/43; G02B 6/4214; G02B 6/12
See application file for complete search history.

(56) References Cited

U.S. PATENT DOCUMENTS

| | | |
|---|---|---|
| 6,315,462 B1 | 11/2001 | Anthamatten et al. |
| 8,736,843 B2 | 5/2014 | Medhat et al. |

(Continued)

OTHER PUBLICATIONS

International Search Report and Written Opinion for PCT/US16/18810 dated Jun. 3, 2016; 10 pages.

(Continued)

*Primary Examiner* — Jennifer Doan
(74) *Attorney, Agent, or Firm* — Loza & Loza, LLP; Holly L. Rudnick

(57) ABSTRACT

A micro-optical bench device is fabricated by a process that provides control over one or more properties of the micro-optical bench device and/or one or more properties of optical surfaces in the micro-optical bench device. The process includes etching a substrate to form a permanent structure including optical elements and a temporary structure. The shape of the temporary structure and gaps between the temporary structure and permanent structure facilitate control of a property of the micro-optical bench and/or optical surfaces therein. The process further includes removing the temporary structure from an optical path of the micro-optical bench device.

32 Claims, 17 Drawing Sheets

(51) Int. Cl.
G01J 3/453 (2006.01)
G01J 3/02 (2006.01)

(56) References Cited

U.S. PATENT DOCUMENTS

| | | | |
|---|---|---|---|
| 2003/0139056 A1* | 7/2003 | Lam | B81C 1/00626 438/735 |
| 2003/0174929 A1 | 9/2003 | Rodgers et al. | |
| 2010/0188728 A1 | 7/2010 | Warashina et al. | |
| 2013/0100424 A1 | 4/2013 | Sabry et al. | |

OTHER PUBLICATIONS

Omran et al., Fully Integrated Mach-Zhender MEMS Interferometer with Two Complementary Outputs, IEEE Journal of Quantum Electronics, Feb. 2012, vol. 48, No. 2, p. 244-251.

Lipson et al., A 1-D Photonic Band Gap Tunable Optical Filter in (110) Silicon, Journal of Microelectromechanical Systems, Jun. 2007, vol. 16, No. 3, p. 521-527.

Bashir et al., A MEMS-Based VOA With Very Low PDL, IEEE Photonics Technology Letters, Apr. 2004, vol. 16, No. 4, p. 1047-1049.

Liu et al., A Review of MEMS External-Cavity Tunable Lasers, Journal of Micromechanics and Microengineering, 2007, vol. 17, p. R1-R13, Institute of Physics Publishing, UK.

Marxer et al., A Variable Optical Attenuator Based on Silicon Micromechanics, IEEE Photonics Technology Letters, Feb. 2009, vol. 11, No. 2, p. 233-235.

Marty et al., Advanced Etching of Silicon Based on Deep Reactive Ion Etching for Silicon High Aspect Ratio Microstructures and Three-Dimensional Micro- and Nanostructures, Microelectronics Journal, Jun. 2005, vol. 36, p. 673-677, Elsevier.

Abdolvand et al., An Advanced Reactive Ion Etching Process for Very High Aspect-Ratio Sub-Micron Wide Trenches in Silicon, Sensors and Actuators, Jan. 2008, vol. 144, p. 109-116, Elsevier.

Saadany et al., A MEMS Tunable Optical Filter Based on Vertical DBR Architecture, DTIP of MEMS & MOEMS, May 2004, vol. 12, p. 317-321, Montreux, Switzerland.

Jensen et al., Black Silicon Method X: A Review on High Speed and Selective Plasma Etching of Silicon with Profile Control: An In-Depth Comparison Between Bosch and Cryostat DRIE Processes as a Roadmap to Next Generation Equipment, Journal of Micromechanics and Microengineering, Feb. 2009, vol. 19, p. 1-4, Institute of Physics Publishing, UK.

Khalil etal., Characterization of MEMS FTIR Spectrometer, Proceedings of SPIE, 2011, vol. 7930, p. 1-10, MOEMS and Miniaturized Systems.

Juan et al., Controlling Sidewall Smoothness for Micromachined Si Mirrors and Lenses, Journal of Vacuum Science and Technology B, Aug. 1996, vol. 14, p. 4080-4084, AVS: Science & Technology of Materials, Interfaces, and Processing.

Malak et al., Cylindrical Surfaces Enable Wavelength-Selective Extinction and Sub-0.2 nm Linewidth in 250 μm-Gap Silicon Fabry-Pérot Cavities, Journal of Microelectromehcanical Systems, Feb. 2012, vol. 21, No. 1, p. 171-180.

Ayon et al., Deep Reactive Ion Etching: A Promising Technology for Micro- and Nanosatellites, Smart Materials and Structures, Nov. 2001, vol. 10, p. 1135-1144, Institute of Physics Publishing, UK.

Chen et al., Effect of Process Parameters on the Surface Morphology and Mechanical Performance of Silicon Structures After Deep Reactive Ion Etching (DRIE), Journal of Microelectromehcanical Systems, Jun. 2002, vol. 11, No. 3, p. 264-275.

Nilsson et al., Fabrication of Silicon Molds for Polymer Optics, Journal of Micromechanics and Microengineering, Jun. 2003, vol. 13, p. S57-S61, Institute of Physics Publishing, UK.

Agarwal et al., Fabrication of vertical mirrors using plasma etch and KOH: IPA polishing, Journal of Micromechanics and Microengineering, 2007, vol. 17, p. 26-35, Institute of Physics Publishing, UK.

Saadany et al., Free-Space Tunable and Drop Optical Filters Using Vertical Bragg Mirrors on Silicon, IEEE Journal of Selected Topics in Quantum Electronics, Nov. 2006, vol. 12, No. 6., p. 1480-1488.

Saadany et al., MEMS Tunable Michelson Interferometer with Robust Beam Splitting Architecture, IEEE, 2009, vol. 978, No. 1, p. 49-50.

Yu et al., Micromachined Fouiuer Transform Spectrometer on Silicon Optical Bench Platform, Actuators and Microsystems, Jun. 2005, p. 1250-1254, The 13th International Conference on Solid-state Sensors.

Wu et al., Micromachined Free-Space Integrated Micro-Optics, Sensors and Actuators A, Sep. 2005, vol. 50, p. 127-134, Elsevier.

Marxer et al., Micro-Opto-Mechanical 2 2 Switch for Single-Mode Fibers Based on Plasma-Etched Silicon Mirror and Electrostatic Actuation, Journal of Lightwave Technology, Jan. 1999, vol. 17, No. 1, p. 2-6.

Manzardo et al., Micro-sized Fourier spectrometer, Optical Society of America, 2002, p. 1-3, DOMO.

Manzardo et al., Miniature Lamellar Grating Interferometer Based on Silicon Technology, Optics Letters, Jul. 2004, vol. 29, No. 13. p. 1437-1439, Optical Society of America.

Manzardo et al., Miniaturized Time-Scanning Fourier Transform Spectrometer Based on Silicon Technology, Optics Letters, 1999, vol. 24, No. 23, p. 1705-1707.

Khalil et al., Miniaturized Tunable Integrated Mach-Zehnder MEMS Interferometer for Spectrometer Applications, Proceedings of SPIE, 2010, vol. 7594, p. 1-13, MOEMS and Miniaturized Systems IX.

Syms et al., MOEMS Tuning Element for a Littrow External Cavity Laser, Journal of Microelectromechanical Systems, Dec. 2003, vol. 12, No. 6, p. 921-928.

Sabry et al., Optical Characterization Technique for MEMS Comb-Drive Resonators, IEEE, 2009, vol. 978. No. 1, p. 127-128.

Liu et al., Sidewall Roughness Control in Advanced Silicon Etch Process, Microsystem Technologies, 2003, vol. 10, p. 29-34, Springer-Verlag.

Syms et al., Surface Tension Powered Self-Assembly of 3-D Micro-Optomechanical Structures, Journal of Microelectromechanical Systems, Dec. 1999, vol. 8, No. 4, p. 448-455.

Lee et al., Thermal Annealing in Hydrogen for 3-D Profile Transformation on Silicon-on-Insulator and Sidewall Roughness Reduction, Journal of Microelectromechanical Systems, Apr. 2006, vol. 15, No. 2, p. 338-343.

Bargiel et al., Towards Micro-Assembly of Hybrid MOEMS Components on a Reconfigurable Silicon Free-Space Micro-Optical Bench, Journal of Micromechanics and Microengineering, Mar. 2010, vol. 20, p. 1-13, Institute of Physics Publishing, UK.

Masson et al., Tunable Fiber Laser Using a MEMS-Based in Plane Fabry-Perot Filter, IEEE Journal of Quantum Electronics, Sep. 2010, vol. 46, No. 9, p. 1313-1319.

Marxer et al., Vertical Mirrors Fabricated by Deep Reactive Ion Etching for Fiber-Optic Switching Applications, Journal of Microelectromechanical Systems, Sep. 1997, vol. 6, No. 3, p. 277-285.

Lee et al., Vertical Mirror Fabrication Combining KOH Etch and DRIE of (110) Silicon, Journal of Microelectromechanical Systems, Feb. 2009, vol. 18, No. 1, p. 217-227, IEEE.

Summanwar, A, Deep Silicon Etching Using High Density Plasma, MSTIC, Dec. 2009, p. 1-286.

* cited by examiner $h_1 \geq 3h_2 \quad \alpha_1 \leq \alpha_2 \quad \alpha_1 = 90° \pm 0.05°$ $h_1 + h_2 \geq 300\ \mu m$ $D_2 \geq h_1 + h_2$

MICRO-OPTICAL BENCH DEVICE WITH HIGHLY/SELECTIVELY-CONTROLLED OPTICAL SURFACES

CROSS REFERENCE TO RELATED PATENTS

The present U.S. Utility patent application claims priority pursuant to 35 U.S.C. § 119(e) to the following U.S. Provisional patent application(s) which are hereby incorporated herein by reference in their entirety and made part of the present U.S. Utility patent application for all purposes:

1. U.S. Provisional Application Ser. No. 62/119,073, entitled "Micro-optical Bench Device with Highly/Selectively-Controlled Optical Surfaces," filed Feb. 20, 2015, pending.

BACKGROUND OF THE INVENTION

Technical Field of the Invention

The present invention relates in general to micro-optical bench devices, and in particular to the fabrication of optical surfaces within micro-optical bench devices.

Description of Related Art

Micro Electro-Mechanical Systems (MEMS) refers to the integration of mechanical elements, sensors, actuators and electronics on a common silicon substrate through microfabrication technology. For example, the microelectronics are typically fabricated using an integrated circuit (IC) process, while the micromechanical components are fabricated using compatible micromachining processes that selectively etch away parts of the silicon wafer or add new structural layers to form the mechanical and electromechanical components. MEMS devices are attractive candidates for use in spectroscopy, profilometry, environmental sensing, refractive index measurements (or material recognition), as well as several other sensor applications, due to their low cost, batch processing ability and compatibility with standard microelectronics. In addition, the small size of MEMS devices facilitates the integration of such MEMS devices into mobile and hand held devices.

In optical applications, MEMS technology may be incorporated into a micro-optical bench device to enable one or more optical elements to be moveably controlled by a MEMS actuator. Among these applications are interferometers, spectrometers, tunable optical cavities, fiber couplers, optical switches, variable optical beam shapers, optical micro scanners, variable optical attenuators, tunable lasers and many other applications in both sensor and telecommunications domains.

Deeply etched micro-optical benches are typically formed using a Deep Reactive Ion Etching (DRIE) process on Silicon On Insulator (SOI) wafers in order to produce micro-optical and MEMS components that are able to process free-space optical beams propagating parallel to the SOI substrate. Both continuous mode DRIE and pulsed-mode DRIE Bosch processes have been used on SOI wafers. The DRIE Bosch process is a cyclic process switching between an etching cycle in which the substrate is etched in a nearly isotropic manner and a passivation cycle in which the etched sidewalls are protected from the further etching in the next etching cycles. Due to the cyclic nature of the process, scallops are typically formed on the sidewalls of the etched trenches. Although continuous mode DRIE processes avoid the presence of scallops, the etching depth achievable using continuous mode DRIE is typically limited due to the deviation of the energetic ions from the straight-line trajectory.

Within micro-optical benches, the DRIE Bosch process may be used to form both high and low aspect ratio trenches/features. High aspect ratio trenches with a narrow width are of particular interest for MEMS inertial sensors and high density capacitors. In addition, high aspect ratio micromirrors with narrow gaps are generally used in micro-optical benches for creating 1-D photonic band gap filters. In these structures, maintaining the deep progress of etching is challenging as it is more arduous for the etchants to diffuse down to the bottom of the trench and for the etching products to diffuse out. In addition, as a result of scattering on the sidewalls of the trench, the number of ions reaching the bottom of the trench is less for deeper trenches, which leads to inefficient removal of the bottom passivation layer in addition to hampering the passivation layer on the sidewalls. These etching challenges may lead to etched trenches with a positive profile, and may consequently set a limit for the achievable etching depth and aspect ratio.

In contrast, free-space micromirrors are relatively widely separated in free-space, and their surface verticality and smoothness quality are typically of more importance than their aspect ratio. The micromirror surface verticality and roughness are normally controlled by optimizing the DRIE Bosch process and by optionally reducing the cycles' time. Techniques for smoothing out the DRIE Bosch process scallops from the resulting surface using oxidation followed by oxide etching or using short anisotropic wet etching have been proposed. In addition, a combination of a DRIE continuous etching process together with a DRIE Bosch process has been used to produce smooth mirror surfaces at the top part of the mirror. However, the height of the micromirrors in such deeply-etched micro-optical benches is limited, such that beyond this limit, the verticality of the etched surface deteriorates with a highly negative profile and significantly rough surface.

Therefore, what is needed is a method for fabricating high quality deeply-etched micro optical surfaces within micro-optical bench devices that provides control over verticality, surface roughness, coating and overall profile using an optimized deep etching process.

SUMMARY OF THE INVENTION

Various aspects of the present disclosure provide a micro-optical bench device fabricated by a process that provides control over one or more properties of the micro-optical bench device and/or one or more properties of optical surfaces in the micro-optical bench device. The process includes etching a substrate to form a permanent structure including optical elements and a temporary structure. The shape of the temporary structure and gaps between the temporary structure and the permanent structure facilitate control of a property of the micro-optical bench and/or optical surfaces of optical elements therein. The property may include, for example, surface roughness, selective coating of surfaces, or inclination angles of the surfaces with respect to a plane of the substrate. The process further includes removing the temporary structure from an optical path of the micro-optical bench device.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE DRAWINGS

In accordance with aspects of the present disclosure, a high quality, deeply-etched micro-optical bench device can be fabricated with a process that provides control over one or more properties of the micro-optical bench device and/or one or more properties of optical surfaces in the micro-optical bench device. For example, the process may provide high control over verticality, surface roughness, coating and overall profile of one or more surfaces within the micro-optical bench device. The process uses an optimized deep etching process, with the aid of temporary structures. The temporary structures are specifically designed for yielding superior optical surface quality during etching and post-etching process. The temporary structures are removed from the optical path of the micro-optical bench device during the etching process or at the end of the process or by the means of a mechanical actuator. In-plane and out-of-plane mechanical stoppers are used to increase the reliability of fabrication and post-fabrication operation. Such a micro-optical bench device introduces a significant performance boost in a number of applications where free space propagation losses and coupling losses are significant. Among these applications are interferometers, spectrometers, tunable optical cavities, fiber couplers, optical switches, variable optical beam shapers, optical micro scanners, variable optical attenuators, tunable lasers and many other applications in both sensor and telecommunications domains.

Figure 1:
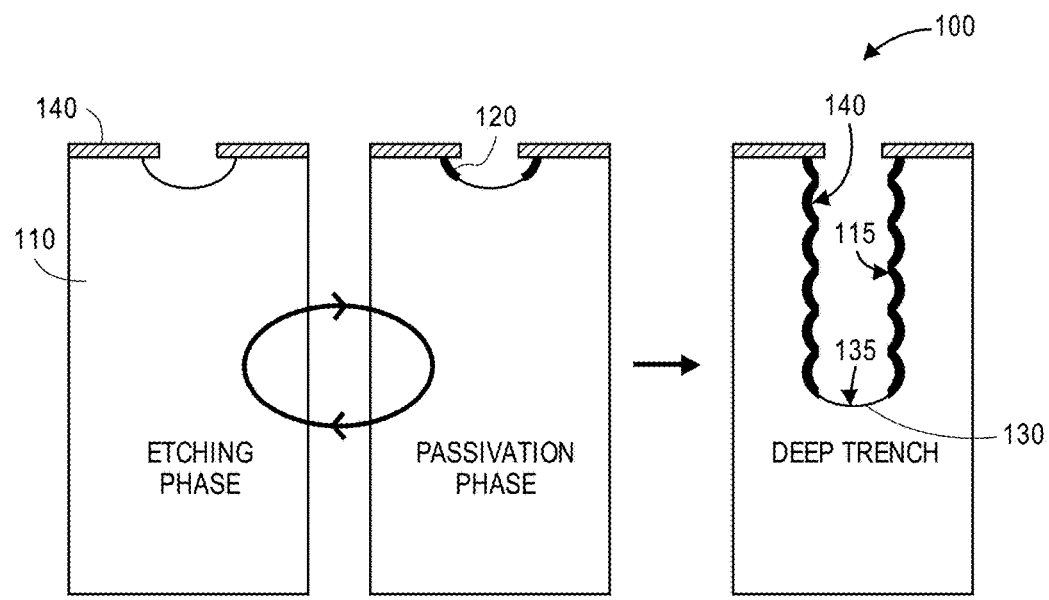
FIG. 1 illustrates an exemplary DRIE Bosch etching process, in accordance with aspects of the present disclosure.

The micro-optical bench device may be fabricated, for example, using a Deep Reactive Ion Etching (DRIE) Bosch process. FIG. 1 illustrates an exemplary DRIE Bosch etching process 100 for fabricating a trench (or other feature) 130 in a substrate 110, such as a Silicon On Insulator (SOI) substrate, in accordance with aspects of the present disclosure. An etching mask 140, such as a layer of photoresist, is deposited onto the substrate 110 and patterned to form openings 145 therein through which the substrate 110 may be etched using the DRIE Bosch process.

The DRIE Bosch process is a cyclic process switching between an etching phase/cycle 102 in which the substrate 110 is etched in a nearly isotropic manner and a passivation phase/cycle 104 in which etched sidewalls/surfaces 115 of the trench 130 are coated with a passivation layer 120 to protect the sidewalls 115 from the further etching in the next etching cycles. During the etching phase, ion bombardment selectively removes the passivation layer 120 from the bottom 135 of the trench 130, in a process known as depassivation, while the sidewalls of the trench are kept protected.

For silicon (Si) etching, sulfur hexafluoride ($SF_6$) and octafluorocyclobutane ($C_4F_8$) are the most commonly used gases for etching and passivation, respectively. However, in other examples, the passivation layer 120 may be, for example, photoresist (PR), grown or deposited $SiO_2$ or SiN or any other material that has good etching selectivity relative to silicon.

Etching and passivation cycle times of the Bosch process, as well as the processing condition, control the peak-to-valley extent of scallops 140 formed on the sidewalls 115 as a result of the cyclic nature of the process. In addition to the scalloping amplitude, important performance metrics for the DRIE Bosch etching process include the lateral undercut below the mask 140, the verticality of the etched sidewalls 115 of the trench 130, the overall etch rate in relation to the mask opening 145, selectivity with respect to the mask material and the etching depth.

Figure 2:
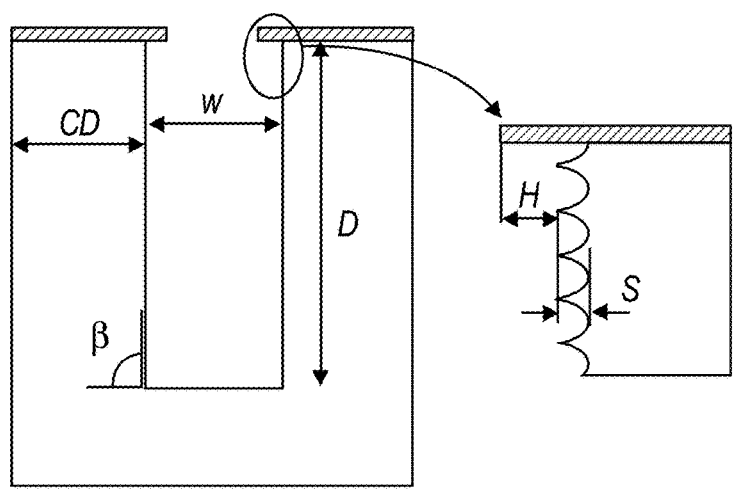
FIG. 2 illustrates exemplary profile parameters of trenches etched using a DRIE Bosch etching process, in accordance with aspects of the present disclosure.

FIG. 2 illustrates exemplary profile parameters of trenches etched using a DRIE Bosch etching process, in accordance with aspects of the present disclosure. As can be seen in FIG. 2, various DRIE profile parameters include the etching depth (D), the resulting trench width (w), the resulting line critical dimension (CD), the sidewall/surface angle ($\beta$), the undercut or overetching (u) and the scalloping depth (s). For micro-optical bench devices including micro-mirrors and MEMS actuators, such as comb-drive actuators, the parameters of the trench width, the critical dimension and the undercut are mainly attributed to the geometry of the comb-drive actuator, while the parameters of the etching depth, sidewall angle and the scalloping depth are related to the optical surface (micromirror) height and quality.

Figure 3:
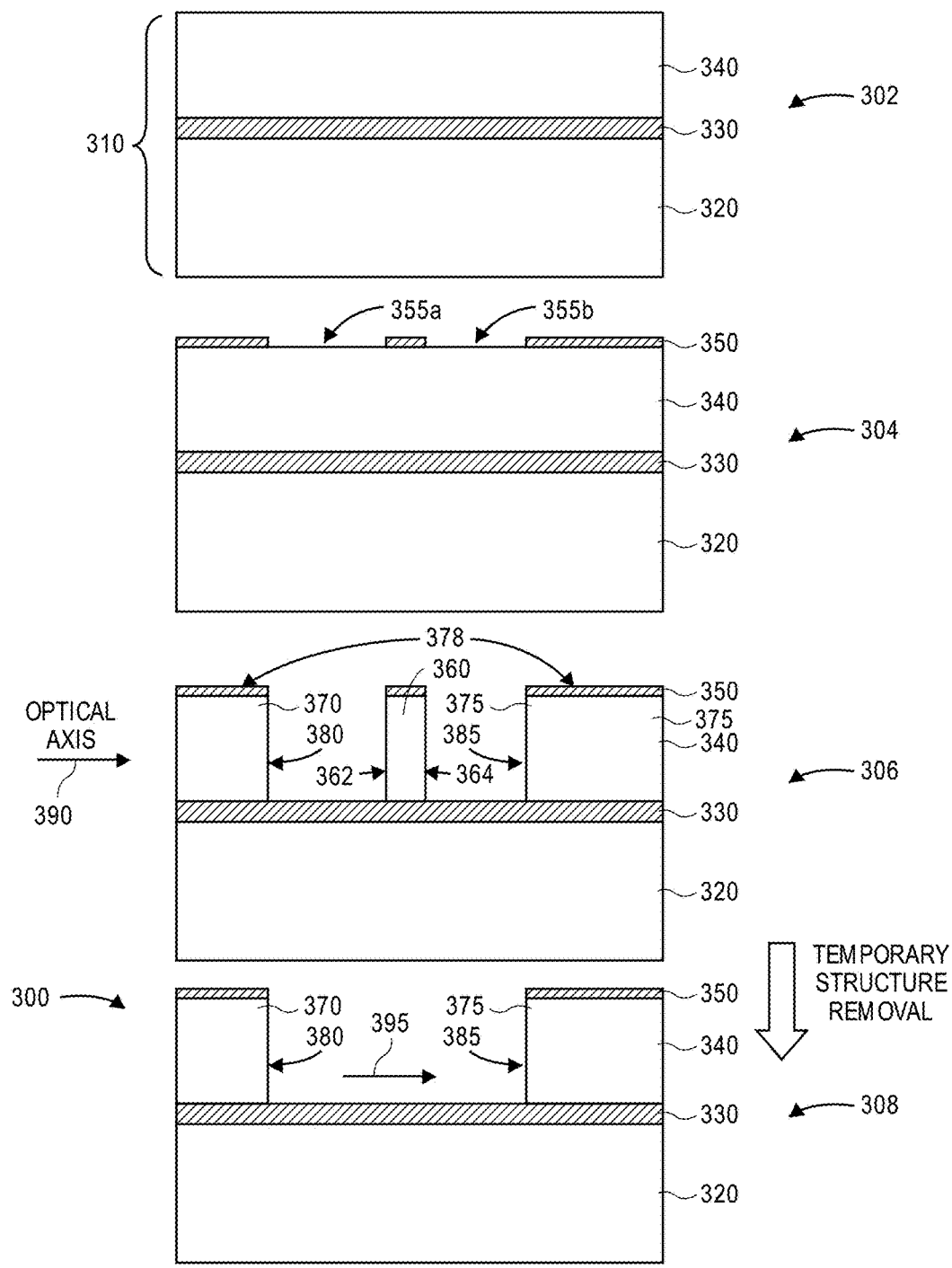
FIG. 3 illustrates exemplary process steps for fabricating a micro-optical bench device using a temporary structure, in accordance with aspects of the present disclosure.

Referring now to FIG. 3, there is illustrated exemplary process steps for fabricating a micro-optical bench device 300 using a temporary structure, in accordance with aspects of the present disclosure. This fabrication process enables the production of deeply-etched micro-optical bench devices with high and selective control of the optical as well as electrical and mechanical component surfaces. This control may be maintained over ultra-deep etching depths; for example ranging from 70 µm to 1000 µm. Achieving such ultra-deep etching depths produces micro-optical bench devices with the high optical throughput needed, for example, when using incoherent light sources.

At process step 302, a substrate 310, such as silicon (Si) or another type of substrate (e.g., plastic, glass, etc.) is provided. The substrate 310 includes a handle layer 320, an etch stop or sacrificial (e.g., buried oxide (BOX)) layer 330 and a device layer 340. In an exemplary embodiment, the handle layer 320 is several times thicker than the device layer 340.

At process step 304, an etching mask 350, such as a layer of photoresist, is deposited onto the device layer 340 and patterned to form openings 355a and 355b therein. At process step 306, the device layer 340 is etched through the mask openings 355a and 355b using, for example, the DRIE Bosch process shown in FIGS. 1 and 2, to produce one or more elements 370 and 375 forming a permanent structure 378 of the micro-optical bench device 300. In one example, etching is performed in an inductively coupled plasma reactor with $SF_6$ and $C_4F_8$ gases. In this process step, the BOX layer 330 is used as an etch stop layer for the anisotropic (DRIE) etching. The BOX layer 330 may also be used as a sacrificial layer in later processing steps to release any moving parts. For example, if either of the elements 370 or 375 is moveable, the sacrificial layer 330 can be removed to release those elements.

The elements 370 and 375 may include optical, as well as electrical and mechanical components, and may be anchored to the substrate 310 or releasable. The elements 370 and 375 shown in FIG. 3 are vertical elements, such that their surfaces 380 and 385 are perpendicular to the plane of the substrate 310. However, in other embodiments, the surfaces 380/385 of elements 370/375 may have different inclination angles with respect to the plane of the substrate 310. One example of an element is an optical element having a dielectric or metallized surface working in a reflection or refraction mode. Other examples of elements include Micro-Electro-Mechanical Systems (MEMS) actuators, detector grooves, fiber grooves and other components of micro-optical bench devices 300.

In addition, the mask 350 is further designed such that one or more temporary structures 360 are produced during the etching process step 306. For example, as shown in FIG. 3, a temporary structure 360 including first and second surfaces 362 and 364 may be formed. Thus, during the etching step 306, the first opening 355a in the etching mask 350 is designed to form a first trench defining the surface 380 of the element 370 and one surface 362 of the temporary structure 360, and the second opening 355b in the etching mask 350 is designed to form a second trench defining the other surface 364 of the temporary structure 360 and the surface 385 of element 375.

By fabricating the temporary structure 360 during the same etching step as the elements 370 and 375, one or more properties of the surfaces 380 and 385 of the elements 370 and 375 facing the temporary structure surfaces 362 and 364 may be controlled. Examples of surface properties include, but are not limited to, the inclination angle of the surfaces 380 and 385 with respect to a plane of the substrate 310, the roughness of the surfaces 380 and 385, the overall profile of the surfaces 380 and 385 and the selective coating of the surfaces 380 and 385. In addition, the shape of the temporary structure 360 and the size of the gaps (widths) between the temporary structure 360 and the permanent structure 378 may further facilitate control of one or more properties of the micro-optical bench device 300. For example, if the micro-optical bench device 300 includes an interferometer, the temporary structure 360 may be used to control the visibility of an interference pattern produced by the interferometer. In addition, the temporary structure 360 may further be used to control an alignment of interfering beams of the interferometer in a transverse direction with respect to an optical axis of an optical receiving element (e.g., detector, fiber, etc.) of the interferometer.

As shown in FIG. 3, the permanent structure 378, including elements 370 and 375, and the temporary structure 360 are formed within the device layer 340. However, in other embodiments, one or more of the elements 370 and 375 of the permanent structure and/or the temporary structure 360 may be formed within the handle layer 320 or within a combination of the device layer 340 and the handle layer 320. In one aspect of the disclosure, the optical elements (e.g., element 370 and/or 375) of the micro-optical bench device 300 are fabricated such that an optical axis 390 of the micro-optical bench device 300 is parallel to the plane of the substrate 310 and lies within the substrate 310. The optical elements 370 and 375 may further include different crystalline planes of the substrate 310. For example, optical element 370 may be fabricated within a first crystalline plane of the substrate 310, while optical element 375 may be fabricated within a second crystalline plane of the substrate 310.

At process step 308, the temporary structure(s) 360 are removed from an optical path 395 of the micro-optical bench device 300. As used herein, the term optical path 395 refers to a path between two elements (e.g., elements 370 and 375) of the micro-optical bench device 300 and along the optical axis 390 through which a light beam propagates. In an aspect of the disclosure, the temporary structure(s) 360 may be removed from the optical path 395 by releasing or etching the temporary structure(s) 360 from the permanent structure 378. In another aspect of the disclosure, the temporary structure(s) 360 may be removed from the optical path 390 of the micro-optical bench device 300 electro-mechanically.

In order to achieve the desired control over the one or more properties of the surfaces 380 and 385 of the fabricated elements 370 and 375 and/or one or more properties of the micro-optical bench device 300, the respective widths of the mask openings 355 of the etching mask 350 may be varied. For example, with reference now to FIG. 4, the inclination angle of the etched surface with respect to the plane of the substrate or with respect to the optical axis of the micro-optical bench device may be controlled by varying the width of the mask opening. For example, a first width $w_1$ may be used to produce a first surface 385a having a first inclination angle $\beta_1$ that is greater than 90 degrees with respect to the plane of the substrate, a second width $w_2$ may be used to produce a second surface 385b having a zero inclination angle $\beta_2$ with respect to the plane of the substrate and a third width $w_3$ may be used to produce a third surface 385c having a third inclination angle $\beta_3$ that is less than 90 degrees with respect to the plane of the substrate.

Figure 5:
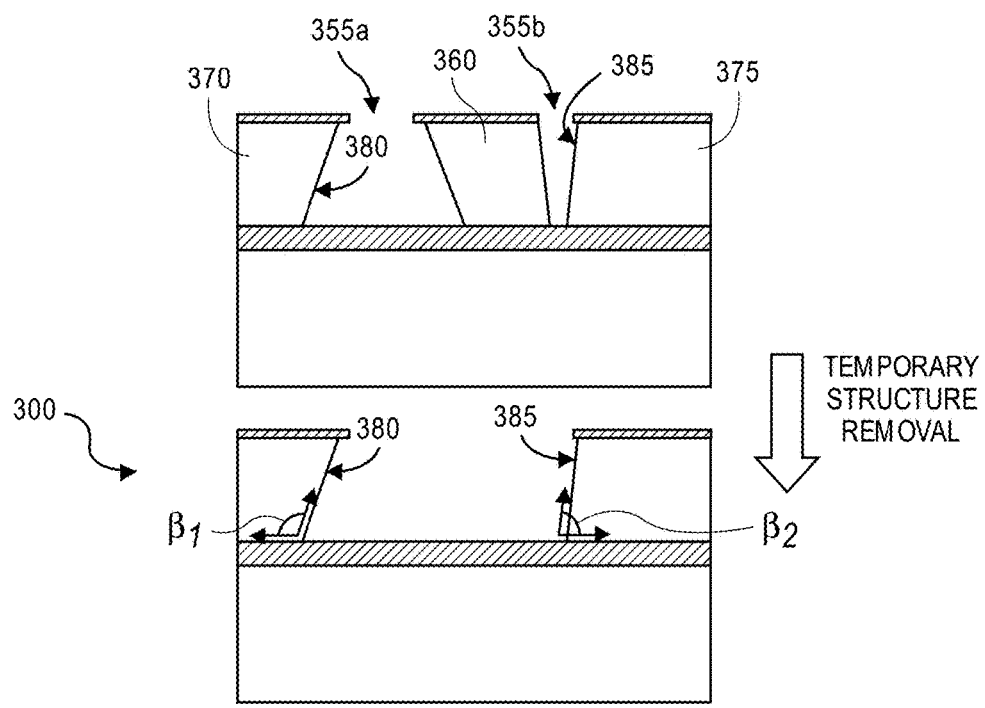
FIG. 5 illustrates exemplary inclination angles of opposing etched surfaces that can be achieved using the same temporary structure, in accordance with aspects of the present disclosure.

As can be seen in FIG. 5, different inclination angles can be achieved in the same micro-optical bench device 300 for the different etched surfaces 380 and 385 using the same temporary structure 360 that can be removed during or at the end of the process. For example, by controlling the respective widths of the mask openings 355a and 355b used to create the temporary structure 360, the inclination angles of the opposing surfaces 380 and 385 facing the temporary structure 360 may also be controlled. In the example shown in FIG. 5, the first opening 355a may have a width selected to produce a surface 380 having a first inclination angle $\beta_1$ that is greater than 90 degrees with respect to the plane of the substrate and the second opening 355b may have a width selected to produce an opposing surface 385 having a second inclination angle $\beta_3$ that is less than 90 degrees with respect to the plane of the substrate.

In some applications, controlling the verticality of the sidewall/surface angle over large etching depths may be important to achieve the optical specifications required. For example, a large etching depth on the order of $\lambda/100$, where $\lambda$ is the wavelength of light in the near infrared spectrum, may be required in different applications when high optical throughput is needed. The verticality of the sidewall angle over such large etching depths may serve to maintain the parallelism between the optical beam and the substrate of in-plane technologies that use the sidewalls as the optical interfaces. For example, a verticality close to 90 degrees may be necessary to avoid optical beam clipping and to allow the integration of many micro-optical components within the optical bench, without sacrificing their performance. In addition, when considering the interference of the optical beams, the interference fringe visibility is maximized when the beams optical axes are kept parallel.

Figure 4:
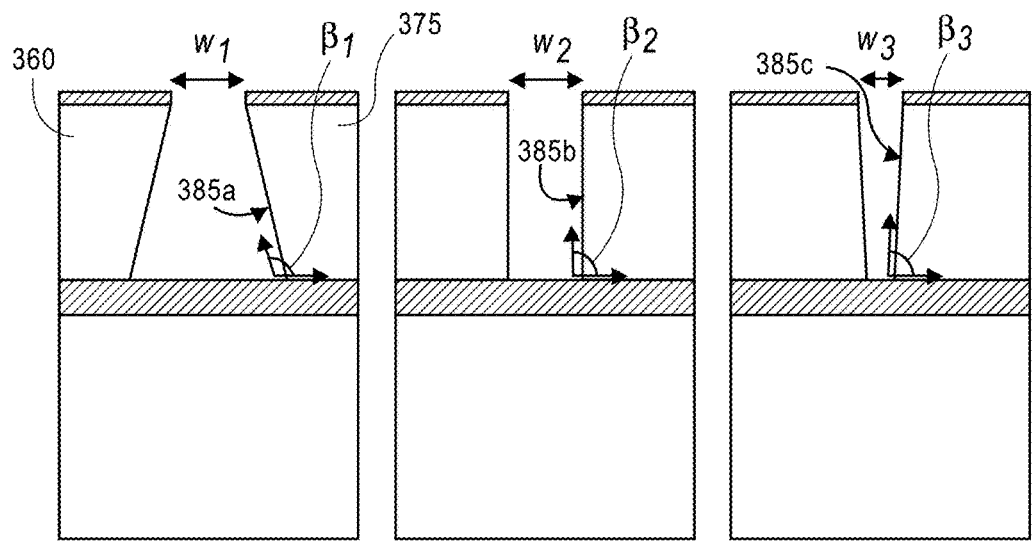
FIG. 4 illustrates exemplary inclination angles of etched surfaces that can be achieved using a temporary structure, in accordance with aspects of the present disclosure.
Figure 6A:
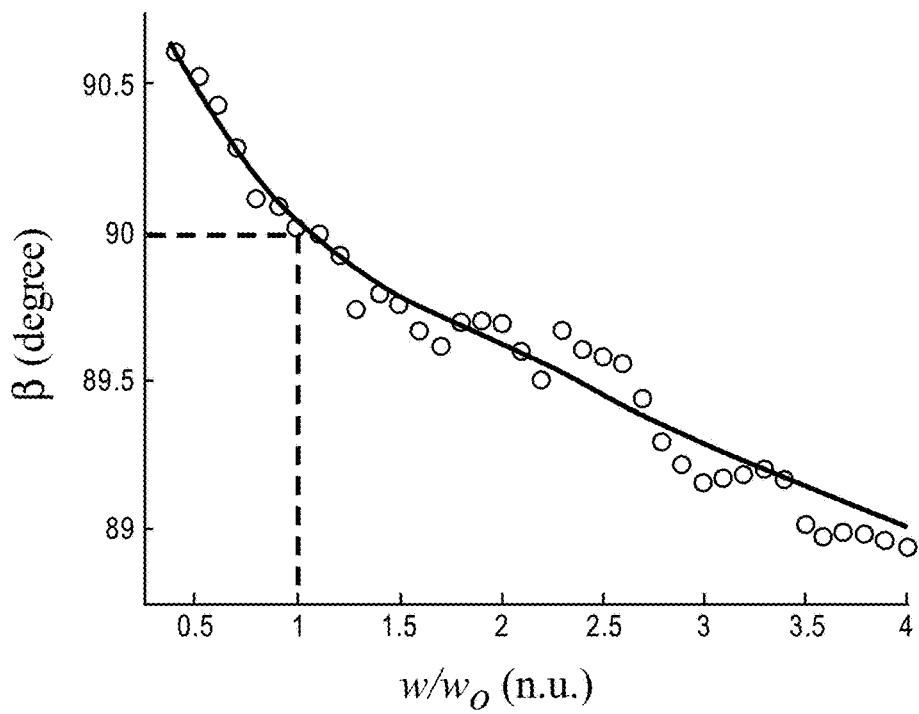
FIGS. 6A and 6B are diagrams illustrating the selective control of the inclination angle of optical surfaces using a temporary structure, in accordance with aspects of the present disclosure.
Figure 6B:
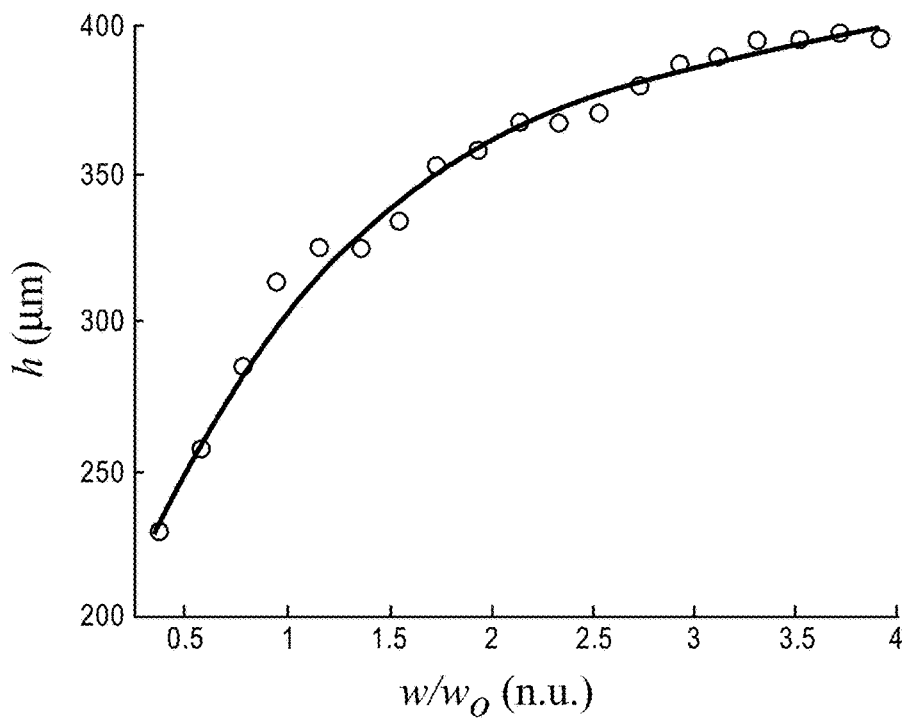

Using a temporary structure to control the width of the mask opening during a DRIE Bosch process, as shown in FIGS. 3-5, may enable a verticality that is better than 90±0.05 degree to be achieved over the etching depth. Referring now to FIGS. 6A and 6B, with optimization of the DRIE process on silicon wafers as well as on SOIs, a verticality of better than 90±0.05 degree was able to be reached over an etching depth up to 600-1000 µm. The sidewall angle was measured for different trench widths and the result is depicted in FIG. 6A. The nominal trench width for which the sidewalls are close to the ideal 90° is denoted by $w_o$ and is used as a reference in the normalized representation of the curve. The angle was measured by cleaving the wafer after etching and measuring the width of the trench at the top and bottom. The corresponding depth of the trenches is shown in FIG. 6B. Varying the trench width about 400% around the ideal value leads to about ±1 degree change in the sidewall angle, but also about ±100 µm change in the etching depth due to the DRIE lag effect. It is therefore possible to achieve control of verticality with ±0.1 degree within a variation of about ±15% in the trench width, as shown in FIG. 6A.

Figure 7A:
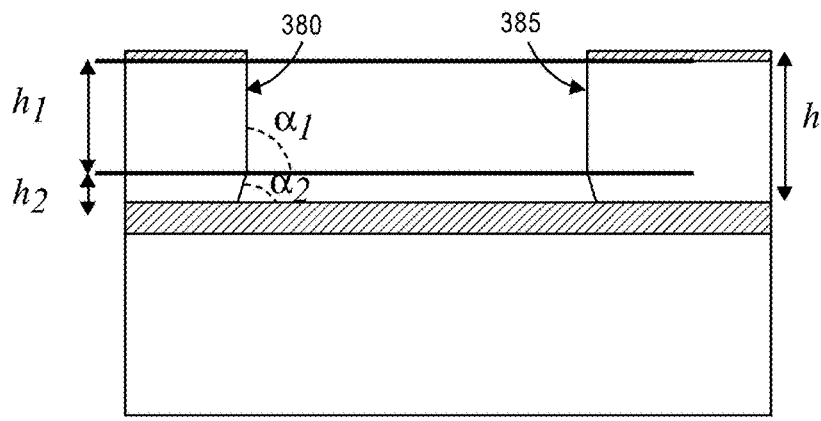
FIG. 7A is a side view illustrating an overall profile of exemplary etched surfaces that were etched using a temporary structure, in accordance with aspects of the present disclosure.

FIG. 7A is a side view illustrating an overall profile of exemplary etched surfaces 380 and 385 that were etched using a temporary structure, in accordance with aspects of the present disclosure. Each etched surface was etched over a total etching depth corresponding to a total device height h. In FIG. 7A, the total device height is composed of a first height $h_1$ and a second height $h_2$. The first device height is much larger than the second height, for example three times or more. The width may be measured at the top of the first height and the bottom of the first height, and similarly for the second height, and the respective inclination angles of the first height and the second height may be deduced from the difference in widths relative to the total etching depths over the respective heights.

For example, as shown in FIG. 7A, the inclination angle of the surface 380 has a first inclination angle $\alpha_1$ for the first height $h_1$ and a second inclination angle $\alpha_2$ for the second height $h_2$. The second inclination angle is smaller than the first one, for example by 0.5 degree or more. The first inclination angle is close to verticality of 90 degrees with a small fabrication tolerance, for example 0.05 degree. The flatness of the etched surface 380 may therefore be evaluated by measuring the trench width across the etching depth and plotting the width against the depth. The flatness may then be deduced from the slope of the curved of the trench width depth. The surface 380 may be considered flat, for example, when the slope is constant.

Figure 7B:
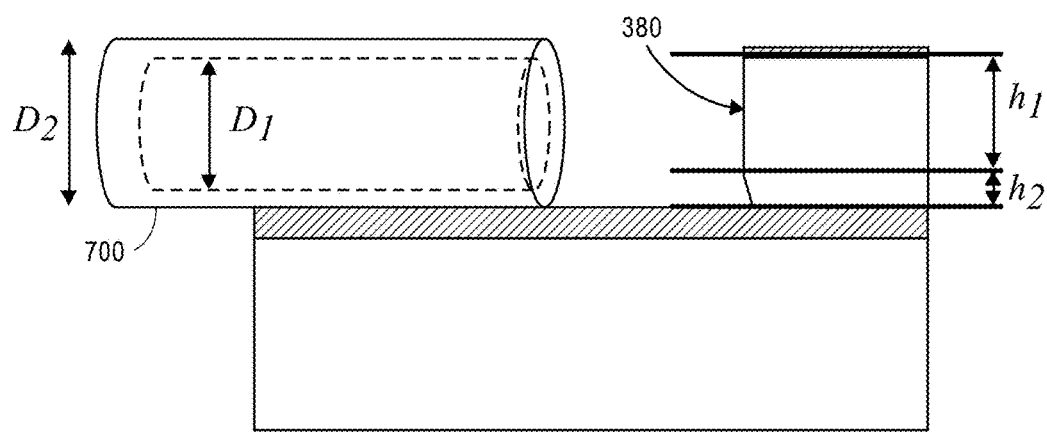
FIG. 7B is a side view of an exemplary etched surface of a micro-optical bench device that is configured to receive a source light beam from a multi-mode optical fiber, in accordance with aspects of the present disclosure.

FIG. 7B is a side view of an exemplary etched surface 380 of a micro-optical bench device 300 that is configured to receive a source light beam from a multi-mode optical fiber 700, in accordance with aspects of the present disclosure. The multi-mode optical fiber 700 carries the light in and/or out of the micro-optical bench device 300. The fiber has core and cladding diameters $D_1$ and $D_2$, respectively, where the core diameter is larger than the cladding diameter. In some examples, the total diameter of the fiber $D_2$ may be larger than the total device layer height of the structure $h_1+h_2$. For example, the device layer height may be 300 µm or larger, up to 1000 µm.

Figure 8C:
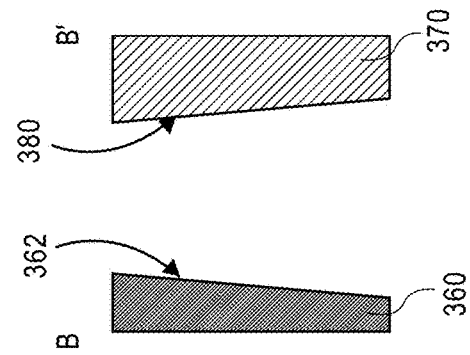
FIGS. 8A-8C illustrate top and cross-sectional views of an overall profile of an exemplary etched surface that was etched using a temporary structure, in accordance with aspects of the present disclosure.
Figure 8B:
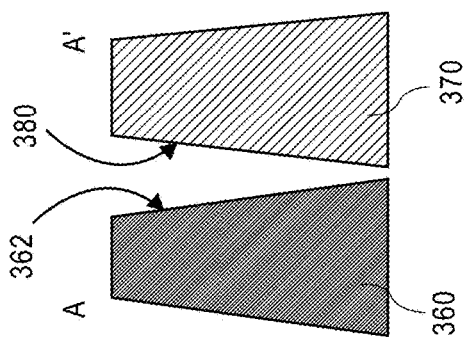
Figure 8A:
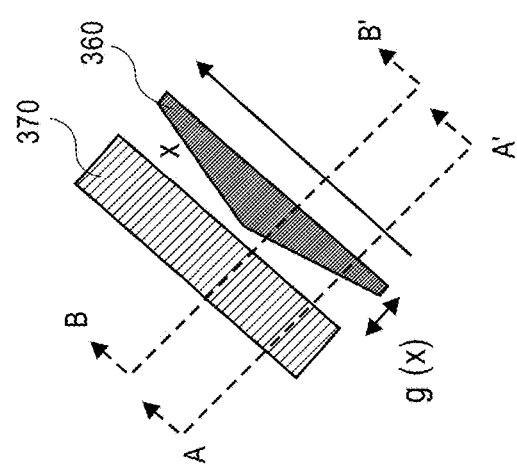

FIGS. 8A-8C illustrate top and cross-sectional views of an overall profile of an exemplary etched surface that was etched using a temporary structure, in accordance with aspects of the present disclosure. As shown in FIG. 8A, the shape of the temporary structure 360 may be used to control the overall profile of an optical element 370 within a micro-optical bench device. The gap (width) between the temporary structure 360 and the optical element 370 may be modulated on the mask pattern to produce a desired profile of the optical element. The resulting surface profiles 362 and 380 of the temporary structure 360 and the optical element 370, respectively, are shown in two different cross-sections in FIGS. 8B and 8C. Thus, controlling the shape/profile of the temporary structure 360 may further control the out-of-plane etching profile of the optical element 370 at different locations on the surface 380 of the optical element 370 in the in-plane direction.

Figure 9:
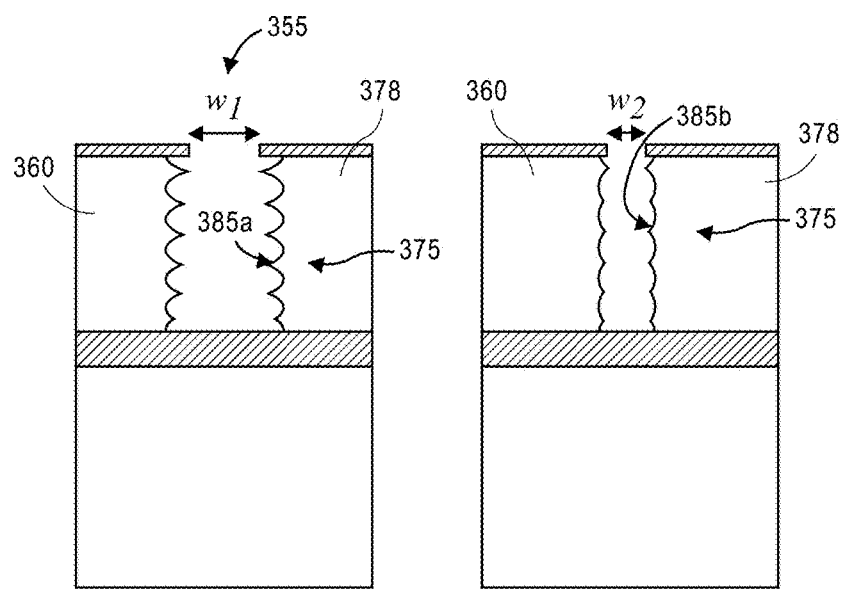
FIG. 9 illustrates exemplary surface roughness characteristics of opposing etched surfaces that can be achieved using a temporary structure, in accordance with aspects of the present disclosure.

Referring now to FIG. 9, the surface roughness has a significant effect on the optical response achieved by any optical MEMS chip/die. The DRIE recipe, as well as the trench width, are factors that determine the resulting roughness. In an aspect of the disclosure, the width of the mask opening 355 between a permanent structure 378 and a temporary structure 360 may be optimized to achieve around 10 nm root-mean-square roughness on a surface 385 of an element 375 of the permanent structure 378 facing the temporary structure 360.

By varying the width of the mask size opening 355, variations in the DRIE scalloping depth may be achieved, as shown in FIG. 9. For example, a first width $w_1$ may be used to produce a first surface 385a having a first surface roughness $\sigma_1$ and a second width $w_2$ less than the first width $w_1$ may be used to produce a second surface 385b having a second surface roughness $\sigma_2$ that is improved with respect to the first surface roughness $\sigma_1$. Thus, by using a temporary structure 360 on the mask design in close proximity to the surface 385b that requires control on their etching scallops, the trench width can be reduced in order to reduce the surface roughness. The roughness may be characterized/measured, for example, either using scanning electron microscope or using an atomic force microscope.

Figure 10:
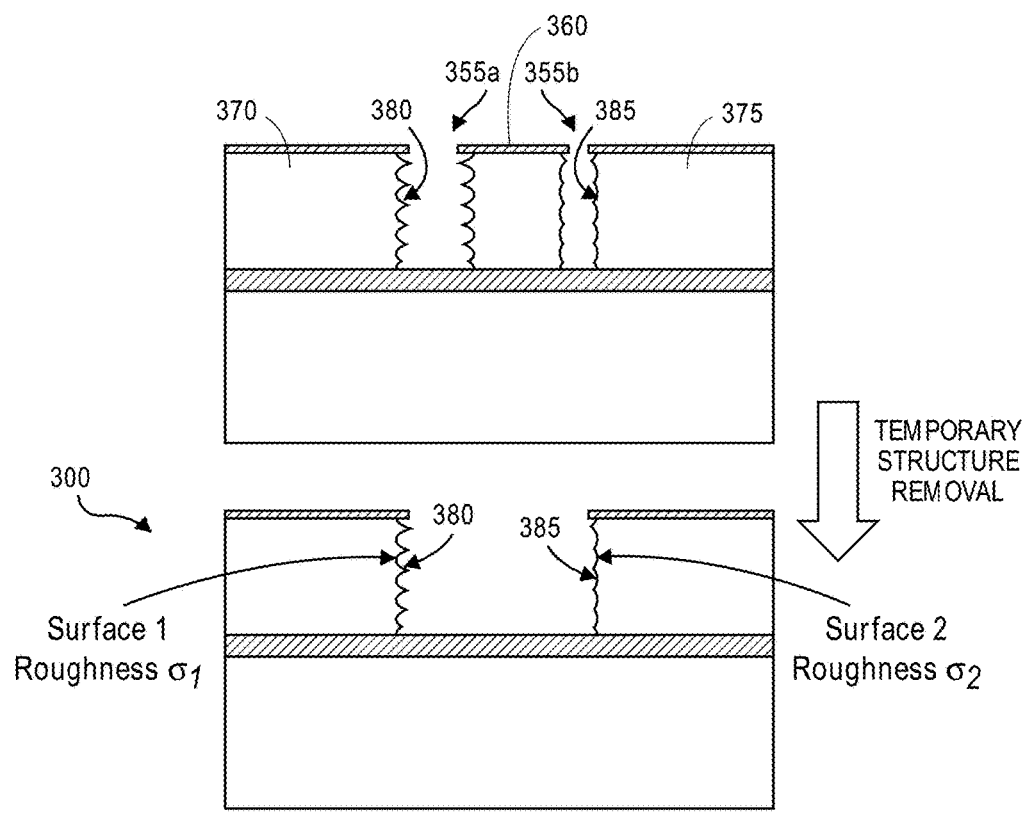
FIG. 10 illustrates exemplary surface roughness characteristics of opposing etched surfaces that can be achieved using the same temporary structure, in accordance with aspects of the present disclosure.

Referring now to FIG. 10, surfaces 380 and 385 with different roughness can be achieved simultaneously in the micro-optical bench device 300 using the same temporary structure 360 that can be removed during or at the end of the process. For example, by controlling the respective widths of the mask openings 355a and 355b used to create the temporary structure 360, the surface roughness of the opposing surfaces 380 and 385 facing the temporary structure 360 may also be controlled. In the example shown in FIG. 10, the first opening 355a may have a width selected to produce a surface 380 having a first surface roughness $\sigma_1$ and the second opening 355b may have width selected to produce a surface 385 having a second surface roughness $\sigma_2$ that is improved with respect to the first surface roughness $\sigma_1$.

Figure 11:
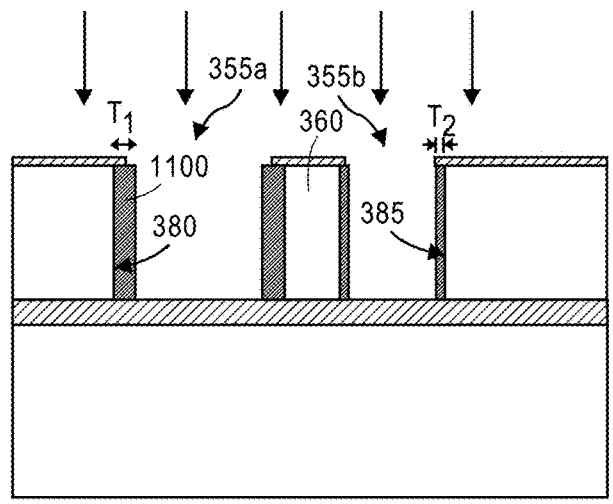
FIG. 11 illustrates an exemplary micro-optical bench device utilizing a temporary structure to control a diffusion process used in post-etching smoothing of the etched surfaces, in accordance with aspects of the present disclosure.

Referring now to FIG. 11, post-etching smoothing of the etched surfaces typically relies on a diffusion mechanism. For example, post-etching smoothing is typically carried out using alkaline etching or oxidation and oxide etching. However, other smoothing methods may also be utilized. In such a diffusion process, trenches with larger widths are subjected to larger diffusion, and thus, more smoothing. For example, as shown in FIG. 11, using oxidation, the thickness of the grown oxide 1100 in the wider trench will be larger and the consumed silicon will be thicker. This larger diffusion leads to less roughness in the wider trenches.

In an aspect of the disclosure, the temporary structure 360 may also be used to control the diffusion process used in the post-etching smoothing of the etched surfaces. For example, by controlling the respective widths of the mask openings 355a and 355b used to create the temporary structure 360, the oxidation thickness, and thus smoothing, of the opposing surfaces 380 and 385 facing the temporary structure 360 may also be controlled. In the example shown in FIG. 11, a first opening 355a may have a width selected to produce a surface 380 having a first oxidation thickness $T_1$ and a second opening 355b may have smaller width selected to produce a surface 385 having a second oxidation thickness $T_2$ that is less than the first oxidation thickness $T_1$.

Figure 12:
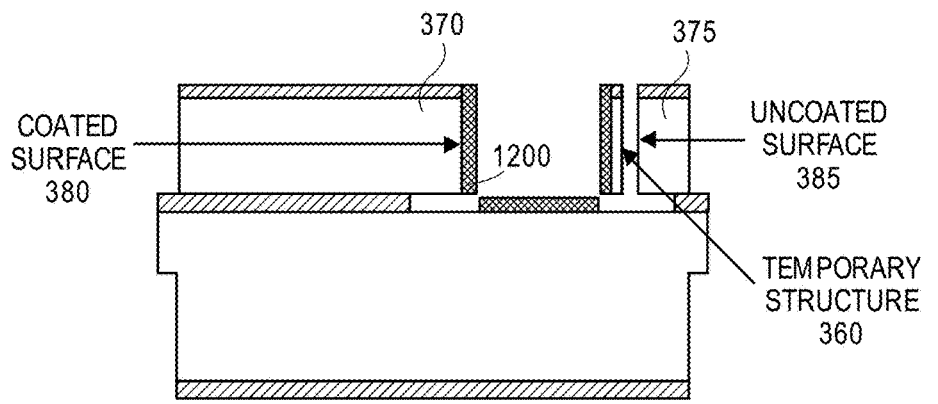
FIG. 12 illustrates an exemplary micro-optical bench device utilizing a temporary structure to control selective coating of the etched surfaces, in accordance with aspects of the present disclosure.
Figure 12:
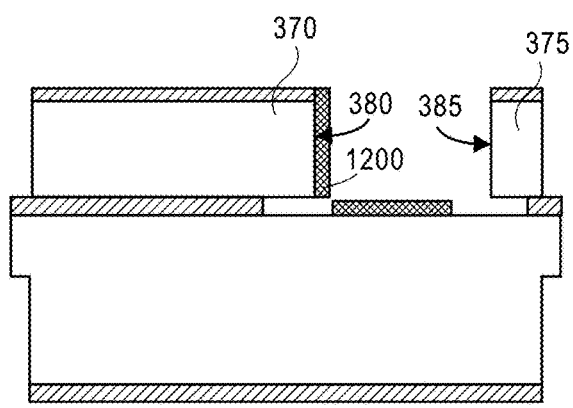

Referring now to FIG. 12, one of the challenges in fabricating micro-optical bench devices 300 that use in-plane propagation of optical beams using the etched sidewalls/surfaces of silicon is to selectively metallize or coat some surfaces while protecting others, especially when the propagation distance between different optical structures/elements is small. One technique for selectively coating surfaces includes the use of a shadow mask. However, most shadow masks have an optical propagation distance limit below which the shadow mask is unable to effectively protect surfaces. Therefore, in an aspect of the disclosure, temporary structures 360 may be used to protect some surfaces during the metallization or other coating process.

In the example shown in FIG. 12, the micro-optical bench device 300 includes a permanent structure including elements 370 and 375 having opposing surfaces 380 and 385. A coating material 1200 (e.g., metallization layer, dielectric layer or other type of coating material) is to be applied to one of the surfaces 380, but not the other surface 385. By using a temporary structure 360 on the mask design in close proximity to the surface 385 that requires protection from the coating material 1200, the temporary structure 360 may block the coating from reaching the protected surface 385, depending on the sputtering angle. After the selective coating process is performed, the temporary structure 360 can be removed, leaving surface 380 with the coating material 1200 applied and surface 385 free from the coating material.

Figure 13:
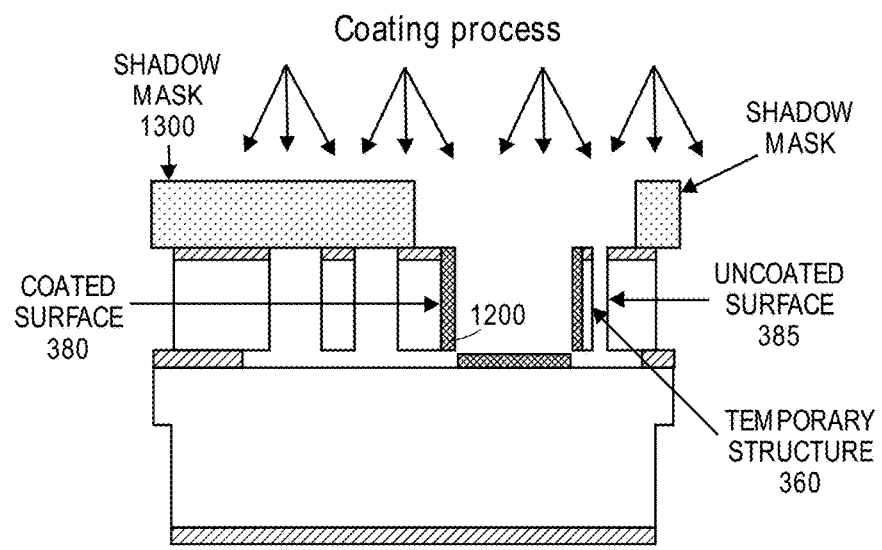
FIG. 13 illustrates an exemplary micro-optical bench device utilizing a temporary structure and a shadow mask to control selective coating of the etched surfaces, in accordance with aspects of the present disclosure.

Referring now to FIG. 13, in addition to the temporary structure 360, a shadow mask 1300 may also be used to protect various surfaces during the selective coating process. For example, the shadow mask 1300 may be used to protect some regions in the SOI/Si wafer/substrate (e.g., those regions having larger optical propagation distances between elements/structures or regions including multiple elements/structures that should be protected from the coating) from the coating material 1200, while the temporary structure 360 is used to protect other regions (e.g., uncoated surface 385) in the SOI/Si wafer/substrate from the coating material 1200 to be deposited on coated surfaces 380.

Figure 14:
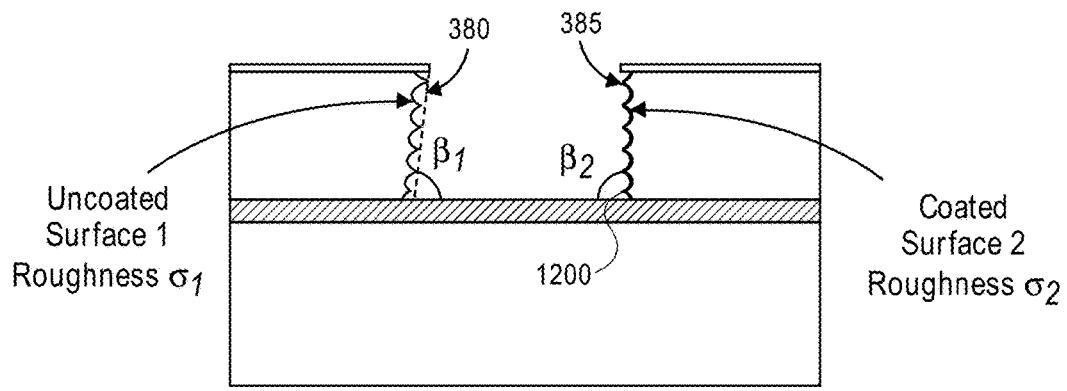
FIG. 14 illustrates exemplary inclination angle, surface roughness and coating characteristics of opposing etched surfaces that can be achieved using the same temporary structure, in accordance with aspects of the present disclosure.

FIG. 14 illustrates exemplary inclination angle, surface roughness and coating characteristics of opposing etched surfaces that can be achieved using the same temporary structure, in accordance with aspects of the present disclosure. As shown in FIG. 14, different inclination angles $\beta_1$ and $\beta_2$ with respect to the plane of the substrate (or optical axis of the micro-optical bench device) of the two etched surfaces 380 and 385 opposing the temporary structure (removed in FIG. 14) may be created using the temporary structure. In addition, different root mean square surface roughness $\sigma_1$ and $\sigma_2$ of the two etched surfaces 380 and 385 may be created during etching of the surfaces 380 and 385 using the same temporary structure. In some examples, the roughness may also be minimized also using the same temporary structure during a post-etching smoothing process. Furthermore, whether coating the surfaces with a dielectric or metallization coating material 1200, the coating process can be selectively carried out using the same temporary structure, such that some of the etched surfaces (i.e., surface 385) are coated and the other surfaces (i.e., surface 380) are not coated with the coating material 1200.

Figure 15:
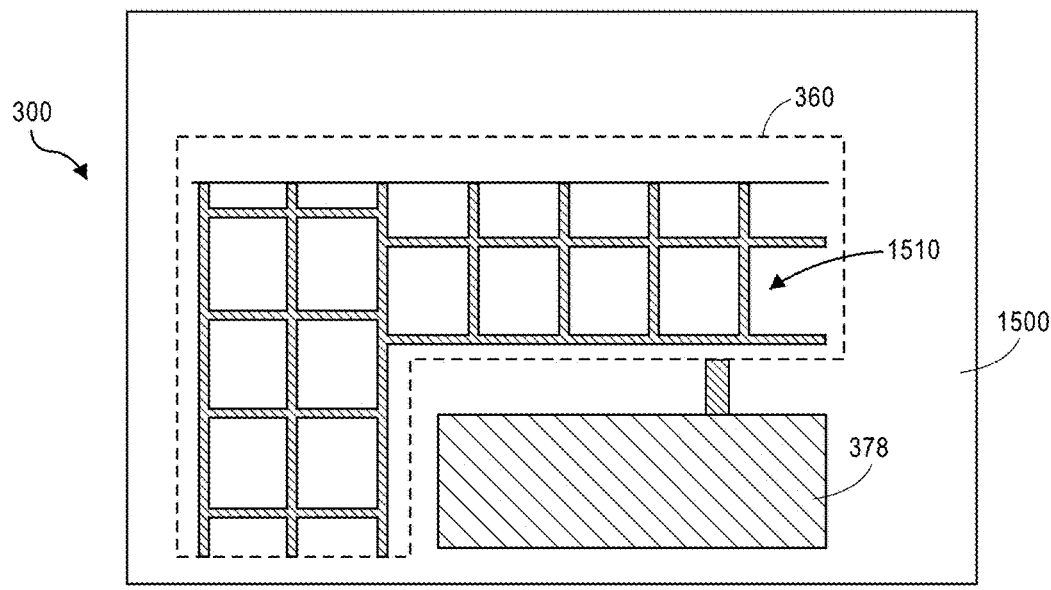
FIG. 15 is a top view of an exemplary micro-optical bench device including a permanent structure and a temporary structure, in accordance with aspects of the present disclosure.

FIG. 15 is a top view of an exemplary micro-optical bench device 300 including a permanent structure 378 and a temporary structure 360, in accordance with aspects of the present disclosure. The micro-optical bench device 300 is fabricated on an SOI wafer 1500. In the example shown in FIG. 15, the temporary structure 360 is permeated to contain release holes 1510 to facilitate removal of the temporary structure 360. In other examples, the temporary structure 360 may be a solid structure devoid of any holes, spaces or gaps. Removal of the temporary structure 360 may be performed, for example, during an HF release step. During such an HF release (either vapour or liquid), the temporary structure(s) 360 may drop inside the HF solution and then be removed at the end of the process. Providing the temporary structure 360 with release holes 1510 aids in the removal of the temporary structure 360 during the HF release step. As another example, the temporary structure 360 may be removed during subsequent etching steps, while the etched surfaces of other fabricated elements may be protected by a passivation layer of oxide or Teflon. In another example, the temporary structure 360 may be designed to be thin enough to be removed by being totally consumed during an oxidation smoothing process.

In an aspect of the disclosure, the temporary structure(s) may further be designed to prevent the temporary structure(s) from touching other permanent structure(s) after release of the temporary structure. For example, the shape of the temporary structure(s) 360 and the size of respective gaps between the temporary structure(s) and permanent structure(s) may be designed to prevent stiction between the temporary structure(s) and the permanent structure(s) upon release of the temporary structure(s).

Figure 16A:
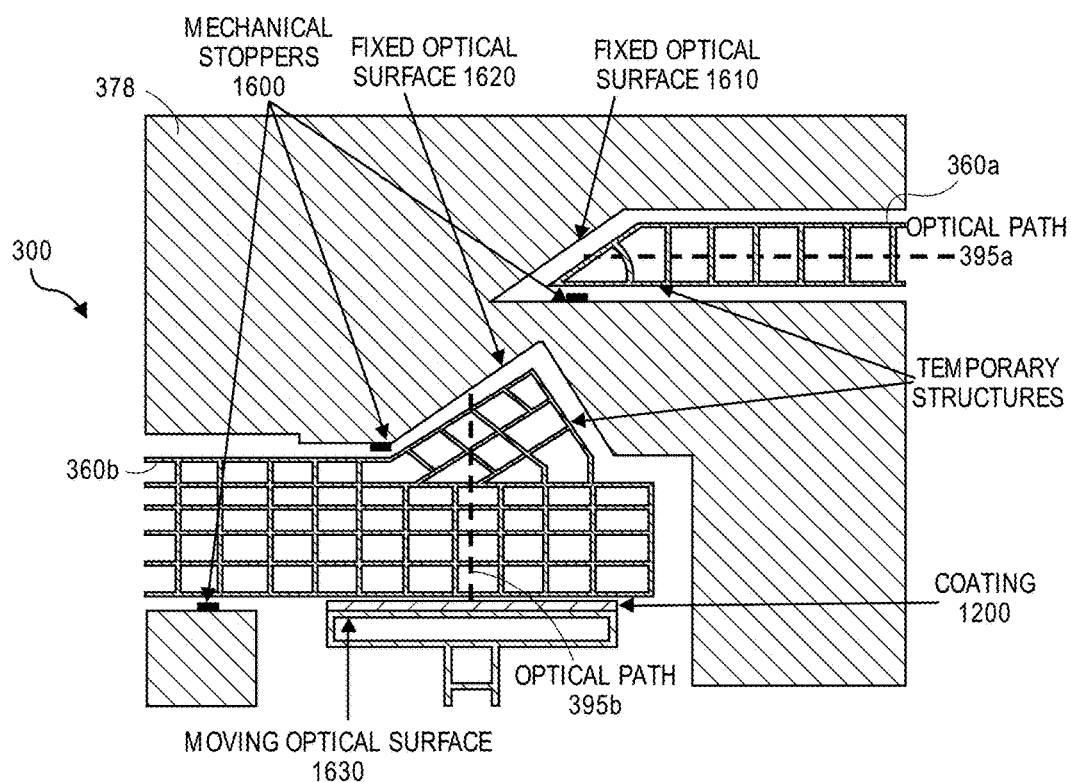
FIG. 16A is a top view of an exemplary micro-optical bench device including a permanent structure, a temporary structure and an in-plane mechanical stopper, in accordance with aspects of the present disclosure.

In addition, referring now to FIG. 16A, to achieve the safe removal of the temporary structure(s), one or more mechanical stoppers 1600 may be formed within the temporary structure 360 or on the adjacent surfaces of the permanent structure 378. In the example shown in FIG. 16A, the mechanical stoppers are attached to (or formed as part of) the permanent structure 378 on surfaces adjacent to the temporary structure.

Thus, in FIG. 16A, a micro-optical bench device 300 is illustrated that includes temporary structures 360a and 360b and a permanent structure 378 with mechanical in-plane stoppers 1600 attached to the permanent structure 378 on surfaces adjacent to the temporary structures 360a and 360b. Temporary structure 360a is fabricated within the optical path 395a directed towards a first fixed optical surface 1610 of the permanent structure 378. Temporary structure 360b is fabricated within the optical path 395b between a second fixed optical surface 1620 of the permanent structure 378 and a moveable optical surface 1630 of the permanent structure 378. The moveable optical surface 1620 has further been coated with a coating material (e.g., metallization) 1200. It should be noted in FIG. 16A, the two fixed optical surfaces 1610 and 1620 and moveable optical surface 1630 controlled by the temporary structures 360a and 360b are within different crystalline planes of the substrate.

Figure 16B:
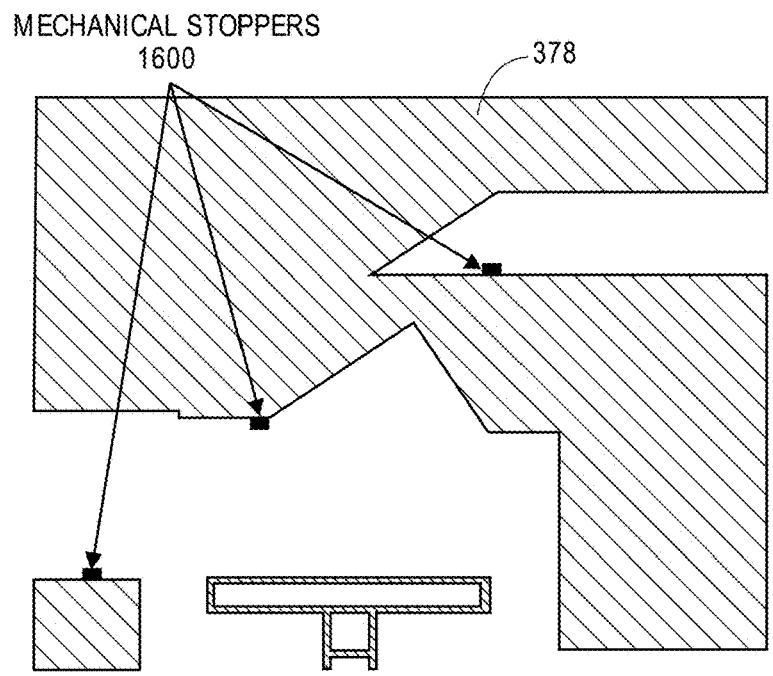
FIG. 16B is a top view of the micro-optical bench device shown in FIG. 16A after removal of the temporary structure from the optical path, in accordance with aspects of the present disclosure.

The distribution of the stoppers 1600 on the permanent structure 378 and the temporary structure(s) 360a and 360b is designed to prevent stiction between the releasable temporary structures 360a and 360b and the permanent structure 378. The dimensions of the stoppers 1600 may further be calculated to prevent the attraction force between the temporary structure surfaces and the adjacent permanent structure surfaces from bringing the surfaces in contact, thus further preventing stiction between the releasable temporary structure(s) 360a and 360b and the permanent structure 378. Thus, by using the mechanical stoppers 1600, the temporary structures 360a and 360b may be removed, using for example an HF release process, without damage to the remaining optical elements in the permanent structure 378, as shown in FIG. 16B.

Figure 16C:
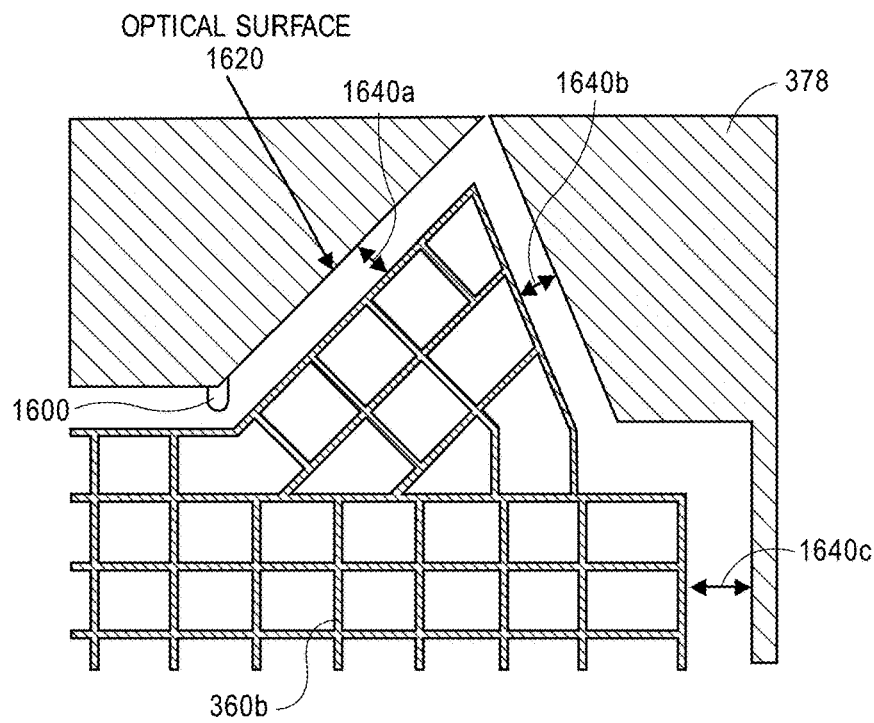
FIG. 16C is a top view an exploded portion micro-optical bench device of FIG. 16A, in accordance with aspects of the present disclosure.

FIG. 16C is a top view an exploded portion micro-optical bench device of FIG. 16A, in accordance with aspects of the present disclosure. As can be seen in FIG. 16C, the optical quality of the optical surfaces (e.g., fixed optical surface 1620) may be controlled not only by the gap 1640a between the optical surface 1620 and the adjacent temporary structure 360b, but also by various other gaps (e.g., gaps 1640b and 1640c) in the design. The gaps 1640a-1640c affect the consumption distribution of the reactants during the deep etching process. Thus, the overall etch rate of the design inside a deep etching reactor may be controlled by the different gaps 1640a-1640c, as well as the release holes size of the temporary structure 360b and other releasable structures in the device. In an aspect of the disclosure, the gaps between the temporary structure 360 and the permanent structure 378 may all be equal.

Figure 17:
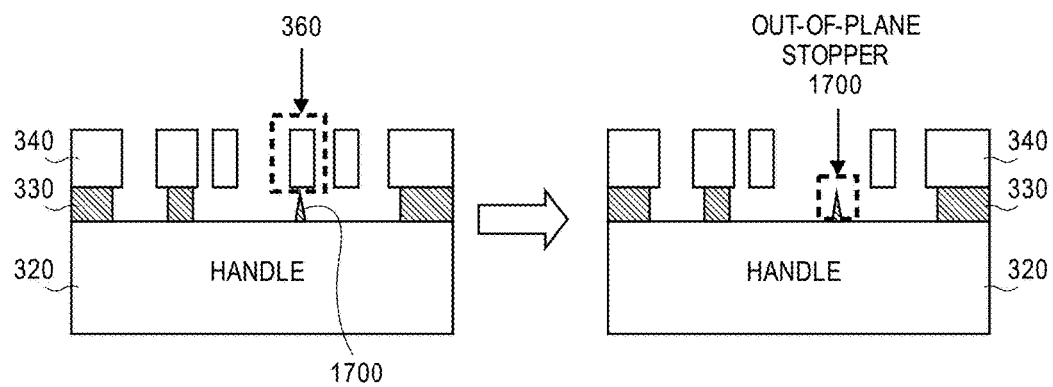
FIG. 17 is a side view of a micro-optical bench device including an out-of-plane mechanical stopper formed in the etch stop layer of an SOI wafer, in accordance with aspects of the present disclosure.

Referring now to FIG. 17, out-of-plane mechanical stoppers 1700 may also be used to protect the permanent structure surfaces during removal of the temporary structure 360. The out-of-plane mechanical stoppers 1700 may be, for example, created between the temporary structure 360 and the top surface of the handle layer 320, as shown in FIG. 17.

For example, by controlling the etching time of the BOX layer 330, out-of-plane mechanical stoppers 1700 may be formed as small/fine structures (e.g., cones) of oxide. These mechanical stoppers 1700 may remain after the temporary structures 360 drop out of the device layer 320 (or are otherwise removed from the optical path of the device). For example, the BOX layer 330 may be etched using a time release process to remove the BOX 330 layer between moveable permanent structures and the handle layer 320 and to leave a trace of the BOX layer 330 between the temporary structure 360 and the handle layer 320 forming a mechanical stopper 1700, and then a physical force may be applied to the temporary structure 360 to release the temporary structure 360 from the mechanical stopper 1700. The dimensions of the mechanical stoppers 1700 may be controlled, for example, by the width of the temporary structures 360 above the mechanical stoppers 1700 and the etching time of the BOX layer 330.

Figure 18:
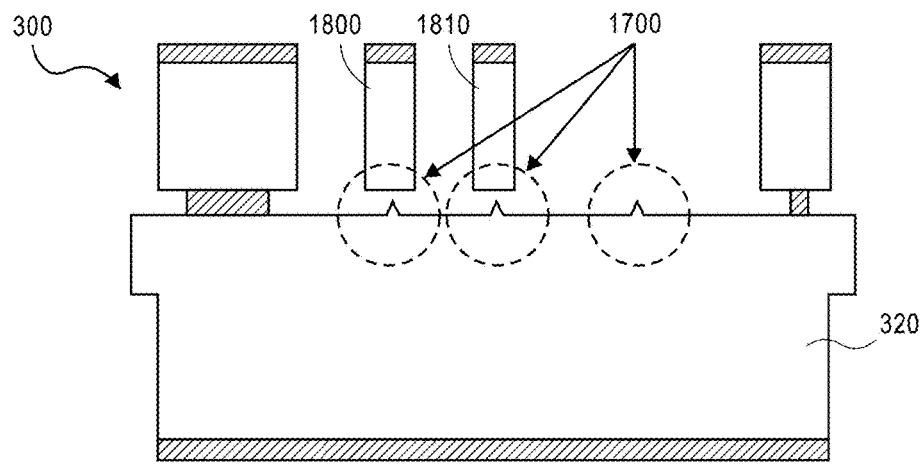
FIG. 18 is a side view of a micro-optical bench device including a fine structure of out-of-plane mechanical stoppers formed in the etch stop layer of an SOI wafer, in accordance with aspects of the present disclosure.
Figure 19:
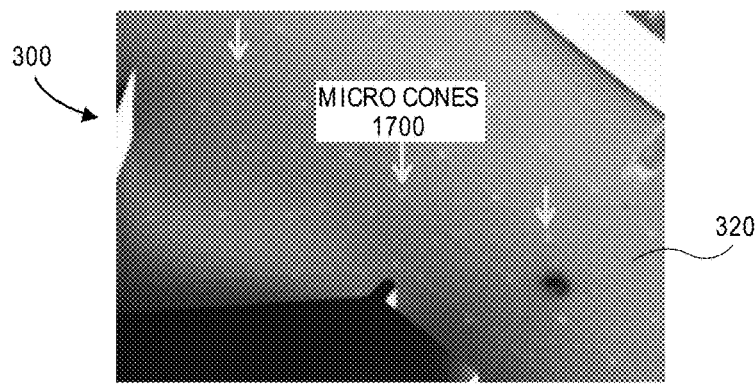
FIG. 19 is a scanning electron microscope image of part of a micro-optical bench device including a fine structure out-of-plane mechanical stoppers formed in the etch stop layer of an SOI wafer, in accordance with aspects of the present disclosure.

Referring now to FIG. 18, such out-of-plane mechanical stoppers 1700 have two functions. First, the stoppers 1700 prevent stiction between the temporary structure 360 and the substrate (or the handle layer 320) during removal of the temporary structure 360. Second, the stoppers 1700 prevent moving structures (e.g., structures 1800 and 1810) in the micro-optical bench device 300 from stiction into the handle layer 320 when the moving structures 1800 and 1810 are substantially displaced from their rest positions by minimizing the possible contact area therebetween. For example, when the moving structures 1800 and 1810 are displaced, the stiffness of the springs in the out-of-plane direction may be reduced, thus making the moving structures 1800 and 1810 more subject to out-of-plane stiction. By including the out-of-plane mechanical stoppers, such out-of-plane stiction may be prevented. A scanning electron microscope image of part of the micro-optical bench device 300 showing the out-of-plane stoppers (micro cones) 1700 of oxide on the handle layer 320 is given in FIG. 19.

Figure 20:
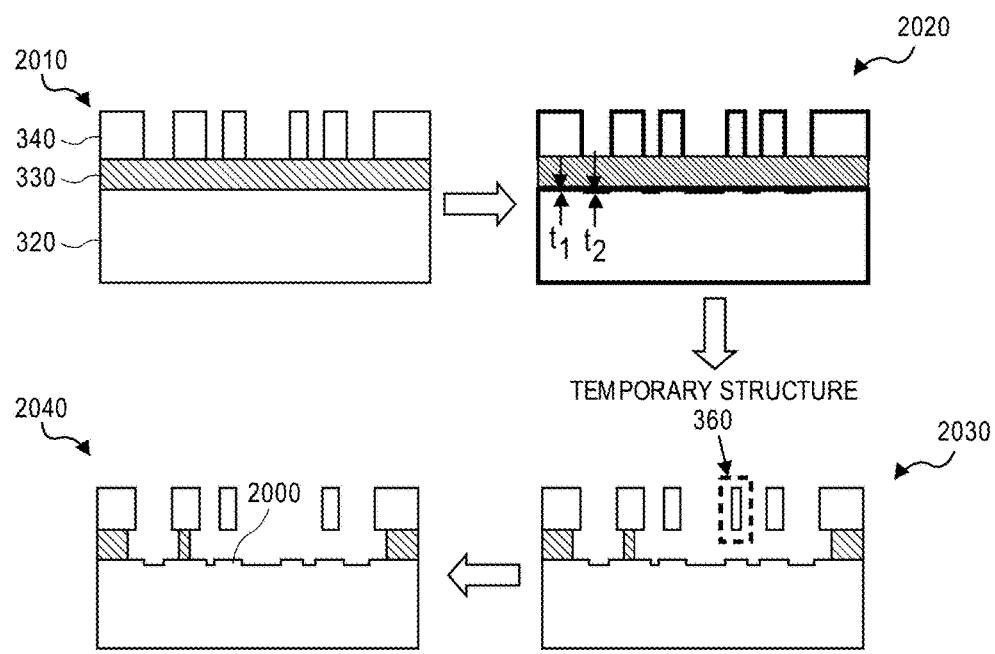
FIG. 20 is a side view of a micro-optical bench device including a fine pattern of out-of-plane mechanical stoppers formed in the handle layer of an SOI wafer, in accordance with aspects of the present disclosure.

Referring now to FIG. 20, out-of-plane mechanical stoppers 2000 may also be formed in the top surface of the handle layer 320. For example, during a post-etching smoothing process involving a thermal oxidation step, as shown in process steps 2010 and 2020, the amount of silicon consumed from the handle layer or amount of oxide grown will be different ($t_1$, $t_2$), depending whether there is a corresponding structure in the device layer 340 or not. In the release step, as shown in process step 2030, the oxide is etched and a pattern of out-of-plane mechanical stoppers 2000 may be left in the top surface of the handle layer 320. These mechanical stoppers 2000 may remain after the temporary structures 360 drop out of the device layer 320 (or are otherwise removed from the optical path of the device), as shown in process step 2040.

Figure 21:
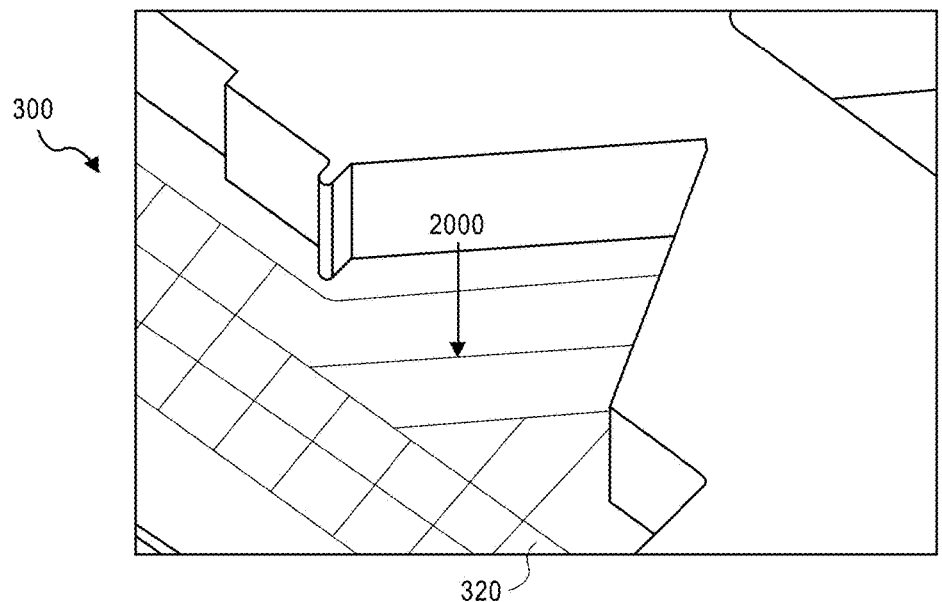
FIG. 21 is a perspective view of part of a micro-optical bench device including a fine pattern of out-of-plane mechanical stoppers formed in the handle layer of an SOI wafer, in accordance with aspects of the present disclosure.

The final shape (or pattern) of the fine structures 2000 left on the handle layer is dependent, for example, on the smoothing process used. A perspective view of part of the micro-optical bench device 300 showing the fine pattern of out-of-plane mechanical stoppers 2000 formed in the handle layer 320 corresponding to the temporary structure is given in FIG. 21.

In general, the temporary structures that are used for DRIE and that are in front of mirrors should be removed before the metallization step, while those that protect other elements from metallization should be removed after metallization. To enable both types of temporary structures to be used within the same micro-optical bench device, the temporary structures can be designed to have different release times.

Figure 22:
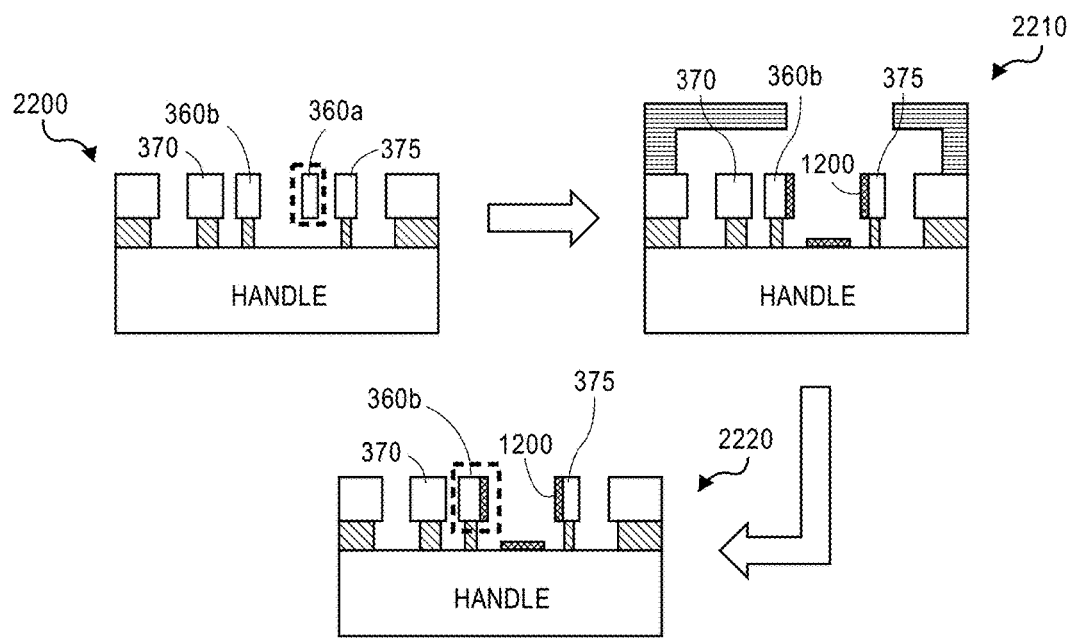
FIG. 22 illustrates an exemplary process for fabricating a micro-optical bench device utilizing multiple temporary structures to control multiple surface properties of etched surfaces, in accordance with aspects of the present disclosure.

FIG. 22 illustrates an exemplary process for fabricating a micro-optical bench device utilizing multiple temporary structures to control multiple surface properties of etched surfaces, in accordance with aspects of the present disclosure. The micro-optical bench device 300 includes a first temporary structure 360a, a second temporary structure 360b and elements 370 and 375. The first temporary structure 360a is designed to control, for example, the inclination angle and/or surface roughness of element 375. The second temporary structure 360b is designed to protect element 370 during a selective coating process. Each temporary structure 360a and 360b is designed to have a different release time to prevent both temporary structures 360a and 360b from being removed during the same release step. For example, the thicknesses of the temporary structures 360a and 360b may vary based on the desired release time. In the example shown in FIG. 22, temporary structure 360a is thinner (in width) than temporary structure 360b. For example, during process step 2200, the first temporary structure 360a in front of element 375 is released using, for example, a controlled HF release having a duration selected to remove temporary structure 360a, but not temporary structure 360b. In process step 2210, a coating material (i.e., metallization) 120 is applied to the surface of element 375, while temporary structure 360b protects the surface of element 370 from metallization. Then, in process step 2220, the second temporary structure 360b is removed using, for example, another HF release process.

Figure 23:
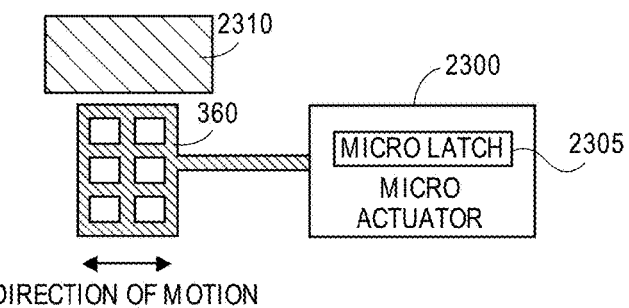
FIG. 23 illustrates a part of an exemplary micro-optical bench device having a temporary structure attached to an actuator for removing the temporary structure from the optical path of the micro-optical bench device, in accordance with aspects of the present disclosure.

The temporary structure(s) may also be removed from the optical path of the micro-optical bench device electromechanically. FIG. 23 illustrates a part of an exemplary micro-optical bench device 300 having a temporary structure 360 attached to an actuator 2300, such as a Micro-Electro-Mechanical Systems (MEMS) actuator, for removing the temporary structure 360 from the optical path of the micro-optical bench device, in accordance with aspects of the present disclosure. The direction of motion of the temporary structure 360 when actuated by the MEMS actuator 2300 may remove the temporary structure 360 from in front of an optical surface 2310 having one or more properties controlled by the temporary structure 360. The MEMS actuator may further include or be coupled to a micro-latch (latch) 2305.

Figure 24:
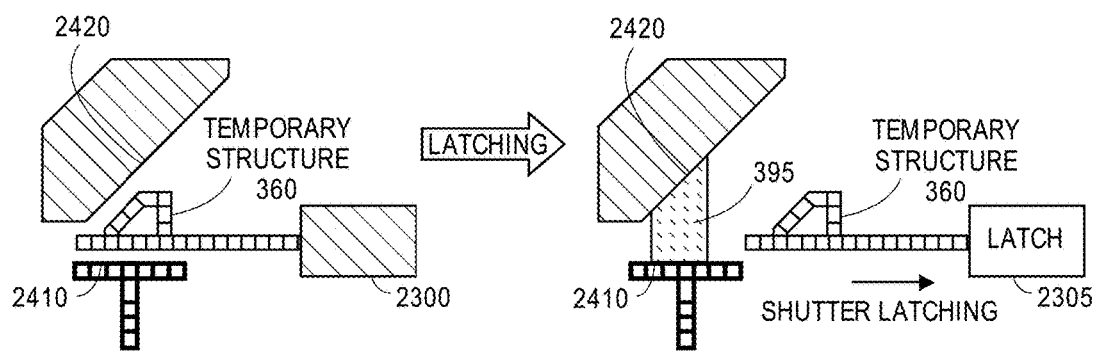
FIG. 24 illustrates an exemplary operation of a micro-optical bench device having a temporary structure attached to an actuator for removing the temporary structure from the optical path of the micro-optical bench device, in accordance with aspects of the present disclosure.
Figure 25:
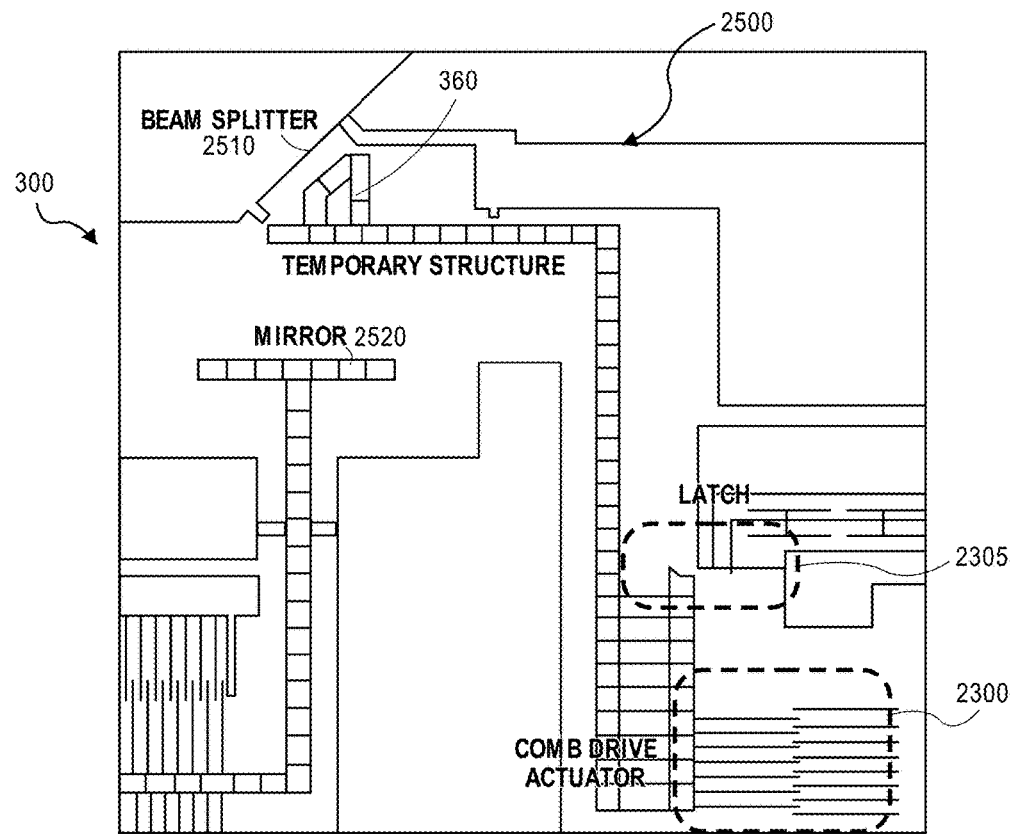
FIG. 25 is a stop view of part of a micro-optical bench device having a temporary structure attached to an actuator for removing the temporary structure from the optical path of the micro-optical bench device, in accordance with aspects of the present disclosure.

Referring now to FIG. 24, when the micro-optical bench device 300 forms at least a part of an optical interferometer 2400 including two optical surfaces 2410 and 2420, the temporary structure 360 may be coupled to a MEMS actuator 2300 and displaced from the optical path 395 between the two surfaces 2410 and 2420 using the MEMS actuator. The temporary structure 360 may then be latched to a certain position by a mechanical latch 2305. FIG. 25 illustrates a top view of a micro-optical bench device 300 including an optical interferometer 2400 having a beam splitter 2510 and moving mirror 2520 and an active temporary structure 360 attached to a MEMS actuator 2300 including a latch 2305. It should be noted in FIG. 24, the two optical surfaces 2410 and 2420 controlled by the temporary structure 360 are within different crystalline planes of the substrate.

Figure 26:
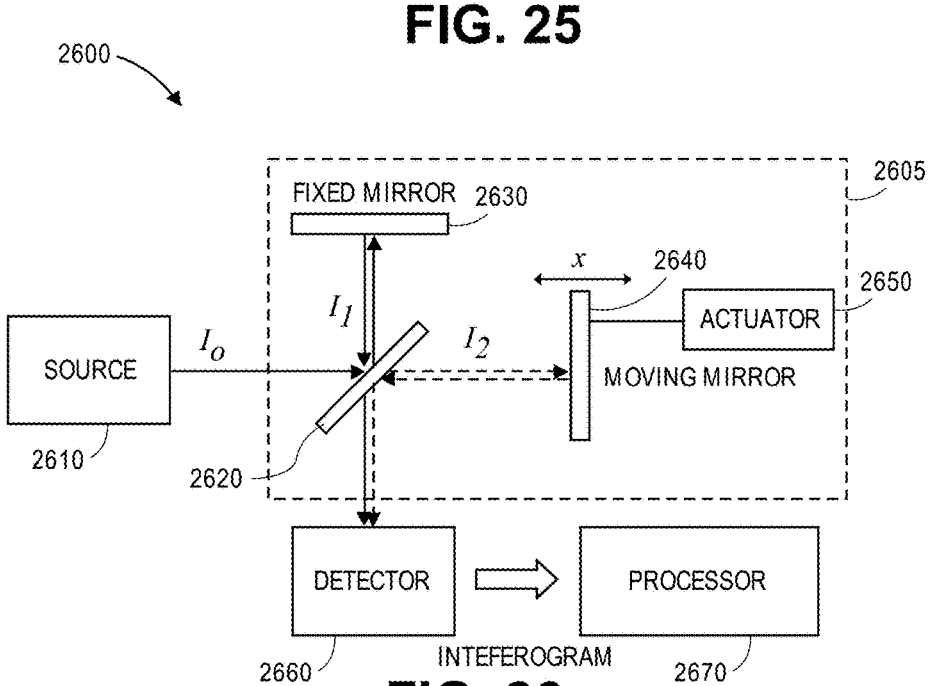
FIG. 26 illustrates an exemplary spectrometer including a Michelson interferometer that can be fabricated as a micro-optical bench device, in accordance with aspects of the present disclosure.

An example of a spectrometer including an interferometer that may be fabricated as a micro-optical bench device using one or more temporary structures is shown in FIG. 26. In the example shown in FIG. 26, the spectrometer 2600 includes a Michelson interferometer 2605. However, in other examples, other types of interferometers, such as Fabry-Perot and Mach-Zehnder interferometers, may be utilized. In FIG. 26, collimated light $I_o$ from a broadband source 2610 is split into two beams $I_1$ and $I_2$ by a beam splitter 2620. One beam $I_1$ is reflected off a fixed mirror 2630 and the other beam $I_2$ is reflected off a moving mirror 2640 coupled to an actuator 2650, such as a MEMS actuator.

In one example, the MEMS actuator 2650 is formed of a comb drive and spring. By applying a voltage to the comb drive, a potential difference results across the actuator 2650, which induces a capacitance therein, causing a driving force to be generated as well as a restoring force from the spring, thereby causing a displacement of moveable mirror 2640 to the desired position for reflection of the beam $L_2$. An optical path length difference (OPD) is then created between the reflected beams that is substantially equal to twice the mirror 2640 displacement.

The reflected beams interfere at the beam splitter 2620, allowing the temporal coherence of the light to be measured at each different Optical Path Difference (OPD) offered by the moving mirror. The signal, called the interferogram, is measured by a detector 2660 at many discrete positions of the moving mirror. The spectrum may then be retrieved, for example, using a Fourier transform carried out by a processor 2670.

The processor 2670 may be a single processing device or a plurality of processing devices. Such a processing device may be a microprocessor, micro-controller, digital signal processor, microcomputer, central processing unit, field programmable gate array, programmable logic device, logic circuitry, analog circuitry, digital circuitry, and/or any device that manipulates signals (analog and/or digital) based on hard coding of the circuitry and/or operational instructions. The processor 2670 may have an associated memory and/or memory element, which may be a single memory device, a plurality of memory devices, and/or embedded circuitry of the processor. Such a memory device may be a read-only memory, random access memory, volatile memory, non-volatile memory, static memory, dynamic memory, flash memory, cache memory, and/or any device that stores digital information.

Figure 27:
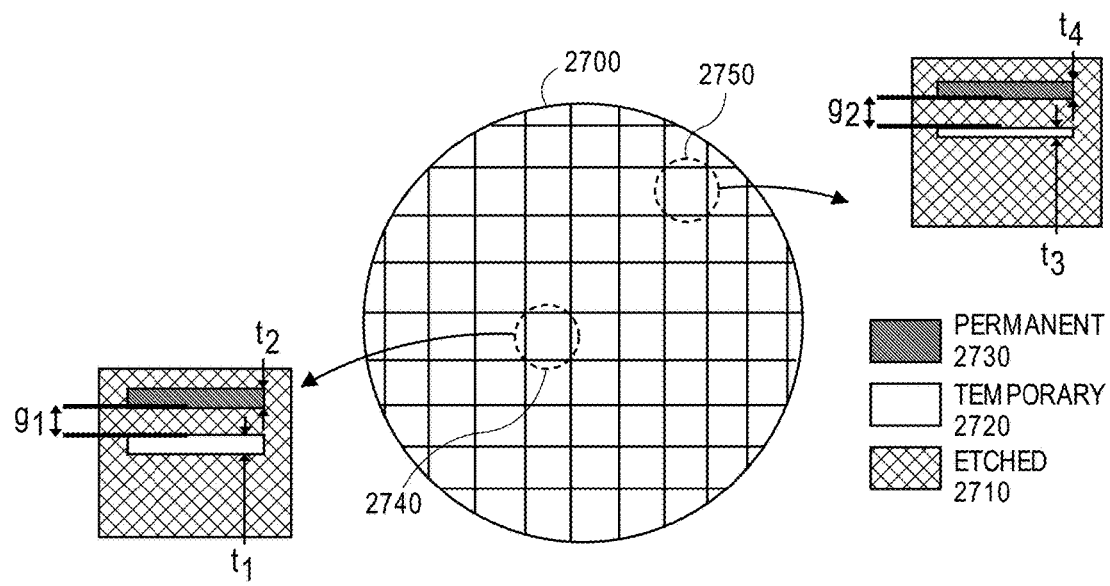
FIG. 27 illustrates an exemplary wafer having a patterned mask thereon including permanent structure etch areas and temporary structure etch areas, in accordance with aspects of the present disclosure.

In addition to the selective processing achieved using the temporary structure, the control provided by the temporary structure(s) may enable high uniformity to be achieved across the wafer and from wafer to wafer in production. For example, referring now to FIG. 27, the uniformity across a wafer 2700 and from wafer to wafer may be achieved by controlling the ratio between the etched volume 2710 and the kept volume (formed of the temporary structure regions 2720 and the permanent structure regions 2730). The etched area 2710 is reduced by the temporary structure regions 2720, which exists during the etching, but is removed at the end of the process.

Due to the variation of the etching species inside the reactor, the temporary structure 2720 and permanent structure 2730 regions may be varied across the wafer as well to counter-back the effect and improve the uniformity. For example, the thicknesses $t_1$ and $t_2$ of the temporary and permanent regions 2720 and 2730, respectively, and thus the etched area $g_1$ between the temporary and permanent regions 2720 and 2730, respectively, on one chip 2740 may be different than the thicknesses $t_3$ and $t_4$ of the temporary and permanent regions 2720 and 2730, respectively, and thus the etched area $g_2$ between the temporary and permanent regions 2720 and 2730, respectively, on another chip 2750.

Figure 28:
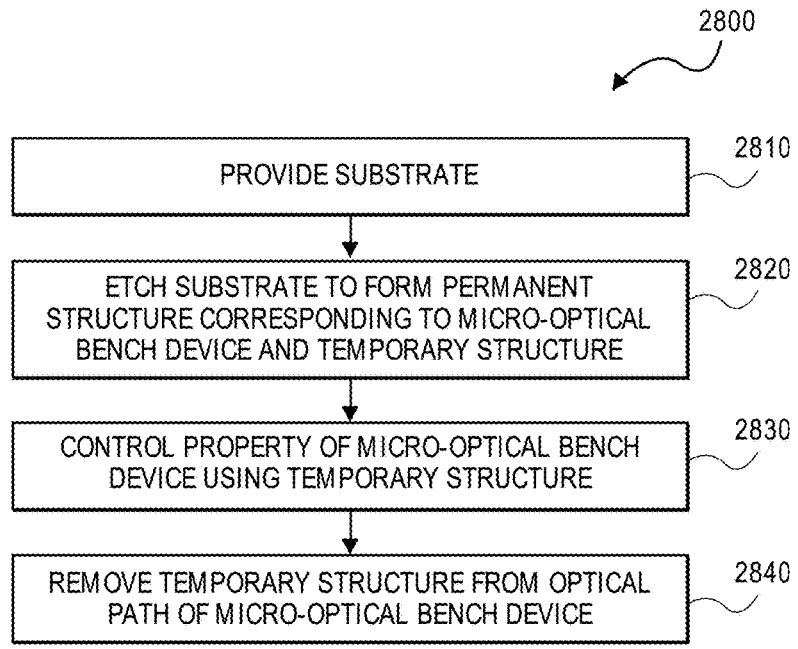
FIG. 28 is a flowchart illustrating an exemplary method for fabricating a micro-optical bench device, in accordance with aspects of the present disclosure.

FIG. 28 is a flowchart illustrating an exemplary method 2800 for fabricating a micro-optical bench device, in accordance with aspects of the present disclosure. The method 2800 may be implemented, for example, using the process shown in FIG. 3 to produce any of the micro-optical bench devices shown in FIGS. 3-26. The method 2800 begins at block 2810 by providing a substrate, such as a SOI wafer or substrate or other type of substrate. At block 2820, the substrate is etched to form both a temporary structure and a permanent structure including at least two optical elements, in which the permanent structure corresponds to a micro-optical bench device.

At block 2830, the temporary structure is used to control at least one property of the micro-optical bench device. For example, the property may include, but is not limited to, one or more of the inclination angle of one or more surfaces of optical elements of the permanent structure with respect to a plane of the substrate, the roughness of the surfaces, the surface profiles, and the selective coating of the surfaces. In an aspect of the disclosure in which the micro-optical bench forms an interferometer, the property may also include, but is not limited to, a visibility of an interference pattern produced by the interferometer and/or an alignment of interfering beams of the interferometer in a transverse direction with respect to an optical axis of an optical receiving element (e.g., detector, fiber, etc.) of the interferometer.

At block 2840, the temporary structure is removed from an optical path of the micro-optical bench device including the at least two optical elements. For example, the temporary structure may be released or etched from the substrate or may be electro-mechanically removed from the optical path.

As will be recognized by those skilled in the art, the innovative concepts described in the present application can be modified and varied over a wide range of applications. Accordingly, the scope of patents subject matter should not be limited to any of the specific exemplary teachings discussed, but is instead defined by the following claims.

We claim:

1. A method for fabricating a micro-optical bench device, comprising:
   providing a substrate;
   etching the substrate to form a permanent structure including at least two optical elements and a temporary structure, wherein at least part of the permanent structure is formed using the temporary structure;
   forming at least one mechanical stopper in the substrate, wherein the at least one mechanical stopper protects the at least two optical elements during removal of the temporary structure; and
   removing the temporary structure by releasing or etching the temporary structure to produce the micro-optical bench device;
   wherein the at least two optical elements lie within an optical path of the micro-optical bench device.

2. The method of claim 1, wherein forming the at least one mechanical stopper further comprises:
   forming the at least one mechanical stopper on the permanent structure.

3. The method of claim 1, wherein forming the at least one mechanical stopper further comprises:
   forming the at least one mechanical stopper on the temporary structure.

4. The method of claim 1, further comprising:
   selecting a dimension of the at least one mechanical stopper to prevent stiction between the temporary structure and the permanent structure.

5. The method of claim 1, wherein the substrate includes a device layer, a handle layer and an etch stop layer between the device layer and the handle layer, and wherein etching the substrate further comprising:
   etching the device layer of the substrate to form the permanent structure and the temporary structure.

6. The method of claim 5, wherein forming the at least one mechanical stopper further comprises:

forming the at least one mechanical stopper in the etch stop layer between the temporary structure and the handle layer or within the handle layer.

7. The method of claim 6, wherein forming the at least one mechanical stopper further comprises:
etching the etch stop layer to form the at least one mechanical stopper between the temporary structure and the handle layer.

8. The method of claim 7, wherein a first width of the temporary structure is greater than a first width of a first optical element of the permanent structure, and wherein etching the etch stop layer further comprises:
etching the etch stop layer using a time release process to remove the etch stop layer between the first optical element and the handle layer and to leave a trace of the etch stop layer between the temporary structure and the handle layer, the trace of the etch stop layer forming the at least one mechanical stopper; and wherein removing the temporary structure further comprises:
applying a physical force to the temporary structure to release the temporary structure from the at least one mechanical stopper.

9. The method of claim 6, wherein forming the at least one mechanical stopper further comprises:
applying a thermal oxidation to the substrate after etching of the substrate to produce the at least one mechanical stopper within the handle layer.

10. The method of claim 9, wherein the at least one mechanical stopper is attached to the permanent structure on at least one surface of the permanent structure that is adjacent to the temporary structure.

11. The method of claim 1, wherein the temporary structure is a permeated structure.

12. The method of claim 1, wherein etching the substrate to form the permanent structure and the temporary structure further comprises:
controlling a roughness or an inclination angle of at least one surface of at least one of the at least two optical elements with respect to a plane of the substrate or with respect to an optical axis of the micro-optical bench device using the temporary structure.

13. The method of claim 1, further comprising:
providing a patterned mask having at least one opening therein, a first opening for forming a first trench defining a first surface of a first optical element and a second surface of the temporary structure, the first surface of the first optical element facing the second surface of the temporary structure.

14. The method of claim 13, further comprising:
selecting a first size of the first opening to produce a desired inclination angle of the first surface of the first optical element.

15. The method of claim 13, wherein a width of the first trench is greater than or equal to 40 µm.

16. The method of claim 13, further comprising:
selecting a first size of the first opening to produce a desired width of the first trench; and
varying a trench width of the first trench by no more than 400 percent around the desired width during etching of the substrate to produce an inclination angle of the first surface of the first optical element with a variance of no more than 1 degrees.

17. The method of claim 13, wherein the patterned mask further includes a second opening for forming a second trench defining a third surface of the temporary structure opposite the second surface of the temporary structure and a fourth surface of a second optical element facing the third surface of the temporary structure.

18. The method of claim 17, further comprising:
selecting a first size of the first opening and a second size of the second opening to produce respective inclination angles of the first surface, the second surface, the third surface and the fourth surface.

19. The method of claim 18, wherein the respective inclination angles of the second and third surfaces of the temporary structure are within 0.1 degrees of each other.

20. The method of claim 13, further comprising:
selecting a first size of the first opening to produce a desired surface roughness of the first surface of the first optical element.

21. The method of claim 1, further comprising:
applying a selective coating to etched surfaces of the substrate, wherein a first gap between the temporary structure and a first surface of a first optical element is selected to enable the temporary structure to prevent the selective coating from being applied to the first surface of the first optical element.

22. The method of claim 21, wherein etching the substrate further comprises:
etching the substrate to form an additional temporary structure and an additional optical element of the permanent structure, wherein etching the substrate to form the additional temporary structure and the additional optical element of the permanent structure further includes:
controlling a surface property of an additional surface of the additional optical element during etching thereof using the additional temporary structure; and further comprising:
removing the additional temporary structure prior to applying the selecting coating to the etched surfaces of the substrate.

23. The method of claim 1, further comprising:
applying a thermal oxidation to the substrate after etching thereof, wherein the temporary structure further controls a roughness of a first surface of a first optical element after applying the thermal oxidation.

24. The method of claim 1, wherein etching the substrate to form the permanent structure and the temporary structure further includes:
controlling a profile of a first optical element of the at least two optical elements in an out-of-plane direction at different locations on a first surface of the first optical element in the in-plane direction using the temporary structure.

25. The method of claim 1, wherein at least two optical elements include different crystalline planes of the substrate.

26. The method of claim 1, wherein respective gaps between the temporary structure and the permanent structure are equal.

27. The method of claim 1, further comprising:
preventing stiction between the temporary structure and the permanent structure during removal of the temporary structure.

28. The method of claim 1, wherein etching the substrate further comprises:
etching the substrate to form the at least two optical elements and a Micro-Electro-Mechanical Systems (MEMS) actuator coupled to a first optical element of the at least two optical elements.

29. The method of claim 28, wherein the MEMS actuator comprises a latch, and further comprising:

latching the temporary structure to a position out of the optical path of the micro-optical bench device using the latch.

30. The method of claim 1, wherein the micro-optical bench device includes a spectrometer or an interferometer.

31. The method of claim 30, wherein etching the substrate to form the permanent structure and the temporary structure further comprises:
controlling a visibility of an interference pattern produced by the interferometer using the temporary structure.

32. The method of claim 30, wherein etching the substrate to form the permanent structure and the temporary structure further comprises:
controlling an alignment of interfering beams of the interferometer in a transverse direction with respect to an optical axis of an optical receiving element of the interferometer using the temporary structure.

* * * * *